United States Patent
Shen et al.

(10) Patent No.: US 7,500,172 B2
(45) Date of Patent: Mar. 3, 2009

(54) AMP (ACCELERATED MESSAGE PASSING) DECODER ADAPTED FOR LDPC (LOW DENSITY PARITY CHECK) CODES

(75) Inventors: Ba-Zhong Shen, Irvine, CA (US); Hau Thien Tran, Irvine, CA (US); Kelly Brian Cameron, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 689 days.

(21) Appl. No.: 11/262,574

(22) Filed: Oct. 31, 2005

(65) Prior Publication Data

US 2006/0195754 A1    Aug. 31, 2006

Related U.S. Application Data

(60) Provisional application No. 60/656,566, filed on Feb. 26, 2005.

(51) Int. Cl.
*H03M 13/45* (2006.01)
(52) U.S. Cl. ...................................................... 714/780
(58) Field of Classification Search .................. 714/780
See application file for complete search history.

(56) References Cited

U.S. PATENT DOCUMENTS

| | | |
|---|---|---|
| 3,542,756 A | 11/1970 | Gallager |
| 3,665,396 A | 5/1972 | Forney, Jr. |
| 4,295,218 A | 10/1981 | Tanner |
| 6,430,233 B1 | 8/2002 | Dillon et al. |
| 6,473,010 B1 | 10/2002 | Vityaev et al. |
| 6,567,465 B2 | 5/2003 | Goldstein et al. |
| 6,633,856 B2 | 10/2003 | Richardson et al. |
| 6,757,122 B1 * | 6/2004 | Kuznetsov et al. ............ 360/53 |

(Continued)

FOREIGN PATENT DOCUMENTS

EP    1 610 466 A    12/2005

(Continued)

OTHER PUBLICATIONS

R. G. Gallager, "Low density parity check codes," IRE Trans. Info. Theory, vol. IT-8, pp. 21-28, Jan. 1962.

(Continued)

*Primary Examiner*—Stephen M Baker
(74) *Attorney, Agent, or Firm*—Garlick Harrison & Markison; Shayne X. Short

(57) ABSTRACT

AMP (Accelerated Message Passing) decoder adapted for LDPC (Low Density Parity Check) codes. A novel approach is presented by which the LDPC coded signals may be decoded in a more efficient, faster, and less computationally intensive manner. Soft bit information, generated from decoding a higher layer square sub-matrix of a parity check matrix of the LDPC code, is employed to assist in the decoding of other square sub-matrices in subsequent layers. This approach allows the decoding of an LDPC code whose parity check matrix has column weight more than 1 (e.g., 2 or more), thereby allowing a much broader selection of LDPC codes to be employed in various communication systems. This approach also provides much improvement in terms of BER/BLER as a function of $E_b/N_o$ (or SNR), and it can provide comparable (if not better) performance when performing significantly fewer (e.g., up to 50% fewer) decoding iterations that other approaches.

20 Claims, 15 Drawing Sheets

U.S. PATENT DOCUMENTS

| | | | |
|---|---|---|---|
| 7,120,856 B2* | 10/2006 | Zhang et al. | 714/801 |
| 7,373,585 B2* | 5/2008 | Yedidia et al. | 714/786 |
| 2003/0104788 A1 | 6/2003 | Kim | |

FOREIGN PATENT DOCUMENTS

| | | |
|---|---|---|
| EP | 1 622 276 A | 2/2006 |

OTHER PUBLICATIONS

R. Gallager, Low-Density Parity-Check Codes, Cambridge, MA: MIT Press, 1963.

M. Luby, M. Mitzenmacher, M. A. Shokrollahi, D. A. Spielman, and V. Stemann, "Practical Loss-Resilient Codes", Proc. 29th Symp. on Theory of Computing, 1997, pp. 150-159.

T. J. Richardson and R. L. Urbanke, "The capacity of low-density parity-check code under message-passing decoding," IEEE Trans. Inform. Theory, vol. 47, pp. 599-618, Feb. 2001.

M. M. Mansour and N. R. Shanbhag, "High-throughput LDPC decoder," IEEE Trans. Inform. Theory, vol. 11, No. 6, pp. 976-996, Dec. 2003.

D. E. Hocevar, "A reduced complexity decoder architecture via layered decoding of LDPC codes," Signal Processing Systems, 2004, SIPS 2004, IEEE Workshop on Oct. 13-15, 2004, pp. 107-112.

Hao Zhong and Tong Zhang, "Design of VLSI implementation-oriented LDPC codes," Vehicular Technology Conference, 2003. VTC 2003-Fall. 2003 IEEE 58th, vol. 1, Date: Oct. 6-9, 2003, pp. 670-673 vol. 1.

S. J. Johnson and S.R. Weller, "Quasi-cyclic LDPC codes from difference families," 3rd AusCTW, Canberra, Australia, Feb. 4-5, 2002.

F. Verdier and D. Declercq, "A LDPC parity check matrix construction for parallel hardware decoding," 3rd International Symposium on Turbo-Codes & Related Topics, Brest, France, Sep. 2003.

Mansour M M: "High-Performance Decoders for Regular and Irregular Repeat-Accumulate Codes" Proc, IEEE Global Telecommunications Conference, Nov. 29, 2004, XP010757993, ISBN: 0-7803-8794-5, pp. 2583-2588.

Mansour M M: "Unified Decoder Architectures for Repeat-Accumulate and LDPC Codes" Proc., IEEE ASIMOLAR Conference on Signals, Systems and Computers, Nov. 7, 2004, ISBN: 0-7803-8622-1, pp. 527-531.

Guilloud F.: "Architecture generique de decodeur de codes LDPC" Theses de Docteur de l'Ecole Nationale Superieure des Telecommunications, Jul. 2, 2004, XP002370625, pp. 1-166.

Sharon E., et al: "An Efficient Message-Passing Schedule for LDPC Decoding" Proc., IEEE Convention of Electrical and Electronics Engineers in Israel, Tel Aviv, Israel, Sep. 6, 2004, ISBN: 0-7803-8427-X, pp. 223-226.

Mohommad M. Mansour, "High-Performance Decoders for Regular and Irregular Repeat-Accumulate Codes," IEEE Communications Society, IEEE Global Telecommunications Conference, Globecom 2004, vol. 4, Issue 29, pp. 2583-2588, ISBN: 7-7803-8794-5/04.

Eran Sharon, Simon Litsyn, Jacob Goldberger, "An efficient message-passing schedule for LDPC decoding," Proceedings. 2004 23rd IEEE Convention of Electrical and Electronics Engineers in Israel, 2004, Sep. 6-7, 2004, pp. 223-226.

* cited by examiner

AMP (ACCELERATED MESSAGE PASSING) DECODER ADAPTED FOR LDPC (LOW DENSITY PARITY CHECK) CODES

CROSS REFERENCE TO RELATED PATENTS/PATENT APPLICATIONS

Provisional Priority Claims

The present U.S. Utility Patent Application claims priority pursuant to 35 U.S.C. § 119(e) to the following U.S. Provisional Patent Application which is hereby incorporated herein by reference in its entirety and made part of the present U.S. Utility Patent Application for all purposes:

1. U.S. Provisional Application Ser. No. 60/656,566, entitled "AMP (Accelerated Message Passing) decoder adapted for LDPC (Low Density Parity Check) codes," filed Saturday, Feb. 26, 2005 (Feb. 26, 2005), pending.

Incorporation by Reference

The following U.S. Utility Patent Application is hereby incorporated herein by reference in its entirety and is made part of the present U.S. Utility Patent Application for all purposes:

1. U.S. Utility patent application Ser. No. 10/851,614, entitled "LDPC (Low Density Parity Check) coded signal decoding using parallel and simultaneous bit node and check node processing," filed May 21, 2005 (May 21, 2004), pending.

BACKGROUND OF THE INVENTION

1. Technical Field of the Invention

The invention relates generally to communication systems; and, more particularly, it relates to decoding of signals employed in such communication systems.

2. Description of Related Art

Data communication systems have been under continual development for many years. One such type of communication system that has been of significant interest lately is a communication system that employs iterative error correction codes. Of particular interest is a communication system that employs LDPC (Low Density Parity Check) code. Communications systems with iterative codes are often able to achieve lower bit error rates (BER) than alternative codes for a given signal to noise ratio (SNR).

A continual and primary directive in this area of development has been to try continually to lower the SNR required to achieve a given BER within a communication system. The ideal goal has been to try to reach Shannon's limit in a communication channel. Shannon's limit may be viewed as being the data rate to be used in a communication channel, having a particular SNR (Signal to Noise Ratio), that achieves error free transmission through the communication channel. In other words, the Shannon limit is the theoretical bound for channel capacity for a given modulation and code rate.

LDPC codes are oftentimes referred to in a variety of ways. For example, iterative soft decoding of LDPC codes may be implemented in a number of ways including based on the BP (Belief Propagation) algorithm, the SP (Sum-Product) algorithm, and/or the MP (Message-Passing) algorithm; the MP algorithm is sometimes referred to as a Sum Product/Belief Propagation combined algorithm. While there has been a significant amount of interest and effort directed towards these types of LDPC codes, regardless of which particular manner of iterative decoding algorithm is being employed in the specific case (3 of which are enumerated above: BP, SP, and MP), there still is ample room for improvement in the implementation and processing to be performed within a communication device to complete such decoding. For example, there are a variety of relatively complex and numerically burdensome calculations, data management and processing that must be performed to effectuate the accurate decoding of an LDPC coded signal.

LDPC code has been shown to provide for excellent decoding performance that can approach the Shannon limit in some cases. For example, some LDPC decoders have been shown to come within 0.3 dB (decibels) from the theoretical Shannon limit. While this example was achieved using an irregular LDPC code of a length of one million, it nevertheless demonstrates the very promising application of LDPC codes within communication systems.

FIG. 4 is a diagram illustrating a prior art embodiment of MP (Message Passing) decoding functionality 400. In this prior art embodiment, the bit metrics 410 are initialized and provided to one or more bit engine processors (shown generally as bit engine 421, bit engine 422, bit engine 423, . . . , and bit engine 424). The one or more bit engine processors 421-424 perform bit node processing by updating a plurality of edge messages with respect to a plurality of bit nodes, Medge$_b$, using the initialized bit metrics 410.

This results in the generation of the updated edge messages with respect to a plurality of bit nodes, Medge$_b$, of the first generation. Thereafter, these updated edge messages with respect to a plurality of bit nodes, Medge$_b$, are provided to and stored in an edge memory 430 from which they may subsequently be appropriately retrieved for check node processing using one or more check engine processors (shown generally as check engine 441, check engine 442, check engine 443, . . . , and check engine 444). The one or more check engine processors 441-444 perform check node processing by updating a plurality of edge messages with respect to a plurality of check nodes, Medge$_c$, using the most recently updated plurality of edge messages with respect to a plurality of bit nodes, Medge$_b$. Thereafter, these updated edge messages with respect to a plurality of check nodes, Medge$_c$, are provided to and stored in the edge memory 430 from which they may subsequently be appropriately retrieved for bit node processing using the one or more bit engine processors 421-424.

The one or more bit engine processors 421-424 and the one or more check engine processors 441-444 operate cooperatively to perform iterative decoding processing that involves updating the plurality of edge messages with respect to a plurality of bit nodes, Medge$_b$, and updating the plurality of edge messages with respect to a plurality of check nodes, Medge$_c$. After a final decoding iteration, the most recently updated plurality of edge messages with respect to a plurality of bit nodes, Medge$_b$, is employed to generate soft bit information from which subsequent hard decisions are made to make best estimates of the one or more information bits that have undergone LDPC encoding.

In addition, there are also two known prior art approaches by decoding of LDPC coded signals may be performed in accordance with a LMP (Layered Message Passing) decoding approach. The following two references describe the LMP decoding approach.

[a] M. M. Mansour and N. R. Shanbhag, "High-throughput LDPC decoder," *IEEE Trans. Inform. Theory*, vol. 11, no. 6, pp. 976-996, December 2003.

[b] D. E. Hocevar, "A reduced complexity decoder architecture via layered decoding of LDPC codes," *Signal Processing Systems,* 2004, SIPS 2004, IEEE Workshop on 13-15 October 2004, pp. 107-112.

Using the LMP decoding approach, the parity check matrix, H, of an LDPC code has the following form.

$$H = [H_1 H_2 \ldots H_L]^T. \quad (EQ\ 1)$$

In this form, each of the sub-matrices, $H_i$, has the same number of rows. Moreover, each of the sub-matrices, $H_i$, may further be decomposed as follows:

$$H_i = [H_{i,1} H_{i,2} \ldots H_{i,M}]. \quad (EQ\ 2)$$

In this decomposed form, it is noted that each of these sub-matrices, $H_{i,j}$, is either a p×p matrix in which all elements are either 0 (i.e., an all zero-valued matrix) or a p×p matrix that is a permutation of the identity matrix. While each of the two prior art decoding approaches can provide a means to reduce the total number of decoding iterations required (e.g., because of their layered decoding approach), each of these two prior art decoding approaches is significantly limited, in that, they can only accommodate a sub-matrix, $H_{i,j}$, that is permutation of a single p×p identity matrix.

The use of LDPC coded signals continues to be explored within many newer application areas. One such application area is that of digital video broadcasting. The Digital Video Broadcasting Project (DVB) is an industry-led consortium of over 260 broadcasters, manufacturers, network operators, software developers, regulatory bodies and others in over 35 countries committed to designing global standards for the global delivery of digital television and data services. Publicly available information concerning the DVB is available at the following Internet address:

"http://www.dvb.org/"

The DVB-S2 (i.e., DVB-Satellite Version 2) draft standard is also publicly available via this Internet address, and the current DVB-S2 draft standard may be downloaded in Adobe PDF format at the following Internet address:

"http://www.dvb.org/documents//en302307.v1.1.1.draft.pdf"

The entire contents of this current DVB-S2 draft standard, "Draft ETSI EN 302 307 V1.1.1 (2004-06), Digital Video Broadcasting (DVB); Second generation framing structure, channel coding and modulation systems for Broadcasting, Interactive Services, News Gathering and other broadband satellite applications" is hereby incorporated herein by reference in its entirety and made part of the present disclosure for all purposes.

In addition, the standard "ETSI EN 302 307 V1.1.1 (2005-03), Digital Video Broadcasting (DVB); Second generation framing structure, channel coding and modulation systems for Broadcasting, Interactive Services, News Gathering and other broadband satellite applications" was formally ratified by the ETSI (European Telecommunications Standards Institute) in March 2005. The entire contents of this standard is hereby incorporated herein by reference in its entirety and made part of the present disclosure for all purposes.

In addition, DVB-S2 uses a powerful FEC (Forward Error Correction) system based on concatenation of BCH (Bose-Chaudhuri-Hocquenghem) outer coding with LDPC inner coding. The result is performance which is at times only 0.7 dB from the Shannon limit. The choice of FEC parameters depends on the system requirements. With VCM (Variable Coding and Modulation) and ACM (Adaptive Coding and Modulation), the code rates can be changed dynamically, on a frame by frame basis.

The multiple operational parameters to which a receiving device, that includes a decoder, must operate to be DVB-S2 compliant is very clearly laid out by the operational parameters of the transmission system description. However, as long as a receiving device, that includes a decoder, complies with these operational parameters specified within the DVB-S2 standard, great latitude in the means of implementation is permissible. The generation of signals on the transmission end of a communication channel is clearly laid out within the DVB-S2 standard, and the means by which the receive processing of such signal (at the receiving end of a communication channel) may be performed is widely open to the designer. Clearly, a key design constrain of such receiving devices is to provide for the accommodation of such DVB-S2 signals while providing for very high performance while occupying a relatively small amount of area and having a relatively lower level of complexity.

Within the context of DVB-S2 as well as other types of communication systems, there continues to be a need in the art for faster and more efficient means by which LDPC coded signals (as well as other types of coded signals) may be decoded to provide for a variety of design constraints including operational speed, less computational complexity, less burdensome memory management, as well as overall lower BERs (Bit Error Rates) for various degrees of SNR (Signal to Noise Ratio).

Moreover, there is no means presently in the art to do layered decoding using a low density parity check matrix, H, that has a p×p sub-matrix, $H_{i,j}$, that is a sum of multiple permuted p×p identity matrices. For example, when a p×p sub-matrix, $H_{i,j}$, has more than one "1" value per row or per column, the prior art layered decoding approach does not work.

It is known in the art that the more constraints placed on the construction of an LDPC code inherently limits the LDPC code's performance. The fact that this prior art layered decoding approach can handle only p×p sub-matrices, $H_{i,j}$, having one "1" value per row or per column restricts the selection of LDPC codes that may be employed. By being restricted to only LDPC codes having this format, a designer does not have the flexibility to construct a better performing LDPC code while using this prior art layered decoding approach.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

BRIEF DESCRIPTION OF THE SEVERAL
VIEWS OF THE DRAWINGS

Figure 13:
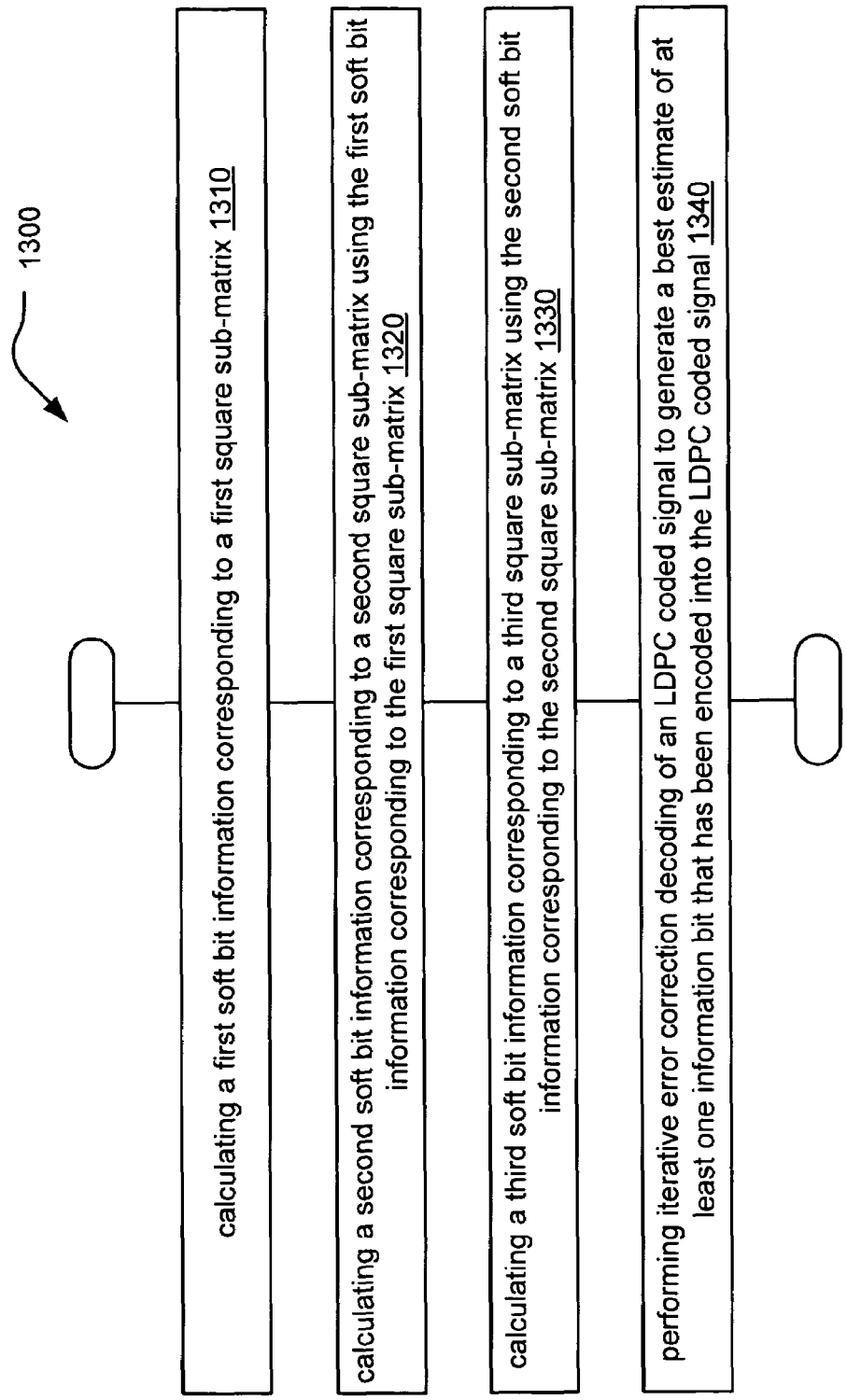
Figure 14:
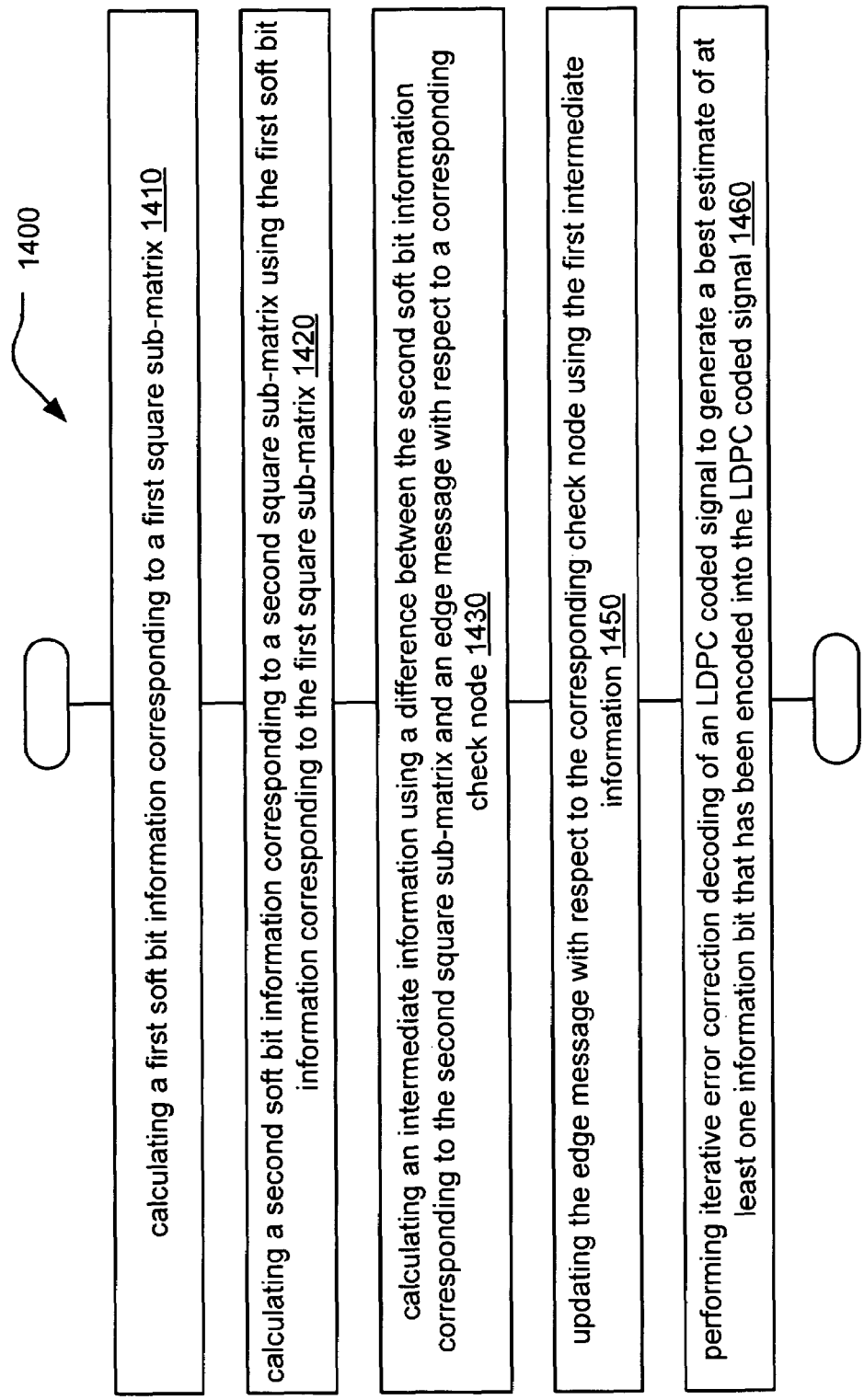
Figure 15:
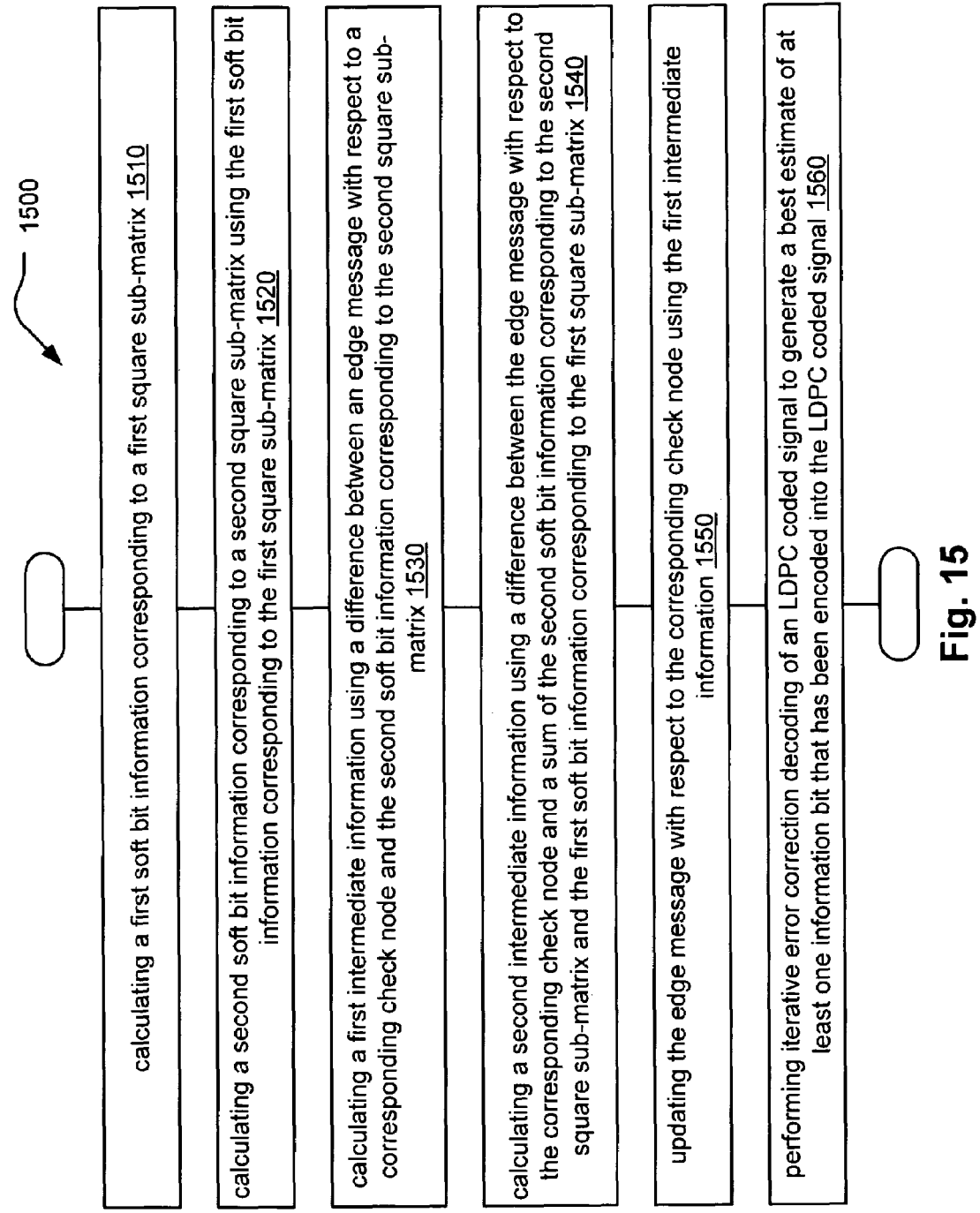

FIG. 13, FIG. 14, and FIG. 15 illustrate various embodiments of methods for decoding LDPC (Low Density Parity Check) coded signals.

DETAILED DESCRIPTION OF THE INVENTION

Various aspects and embodiments of the invention may be found in any number of devices that perform decoding of LDPC (Low Density Parity Check) coded signals. In some instances, the decoding approaches and functionality presented herein are operable to decode and process signals that have been generated and that comply with the DVB-S2 (i.e., DVB-Satellite Version 2) standard.

Figure 1:
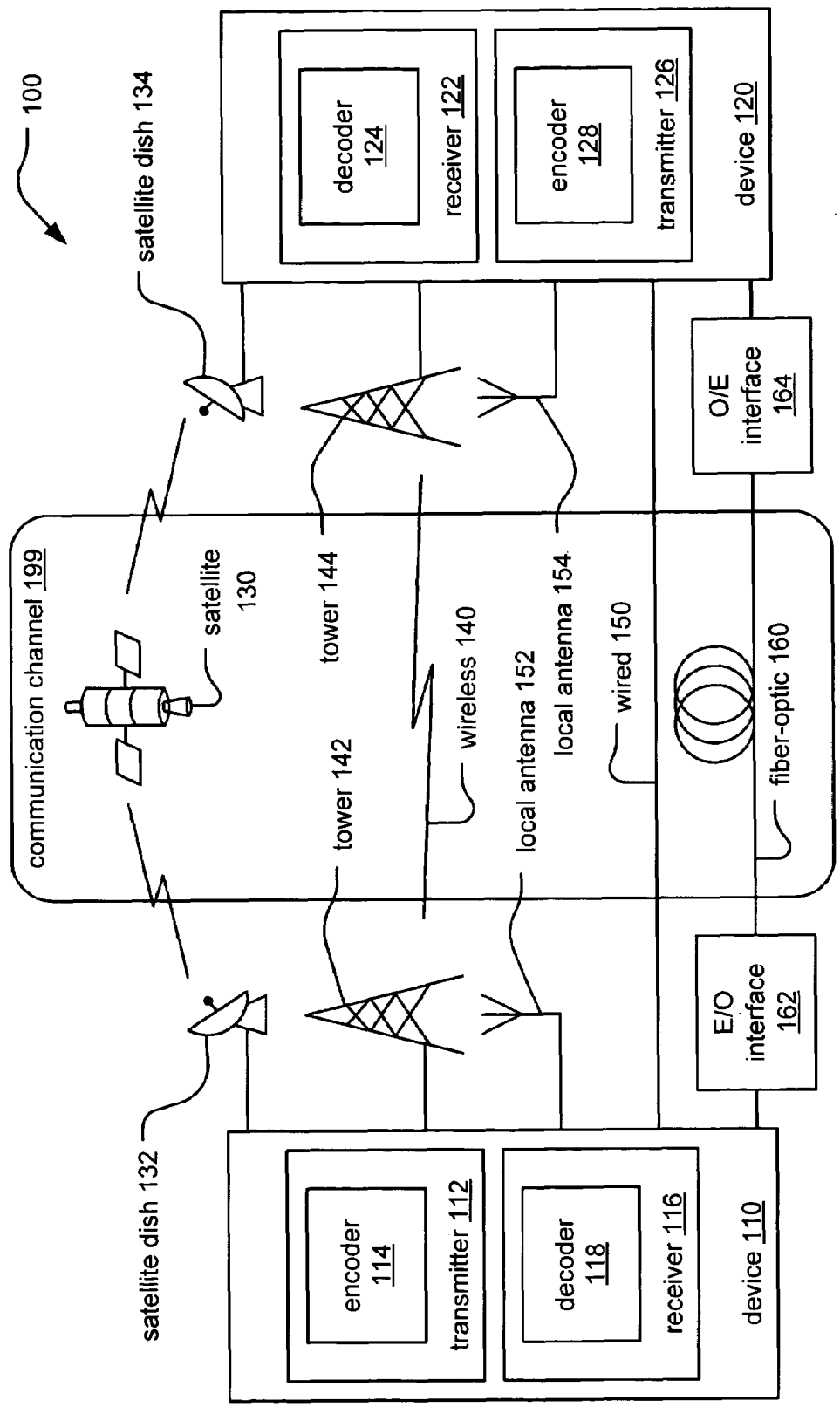
FIG. 1 and FIG. 2 illustrate various embodiments of communication systems.

The goal of digital communications systems is to transmit digital data from one location, or subsystem, to another either error free or with an acceptably low error rate. As shown in FIG. 1, data may be transmitted over a variety of communications channels in a wide variety of communication systems: magnetic media, wireless, fiber, copper, and other types of media as well.

Figure 2:
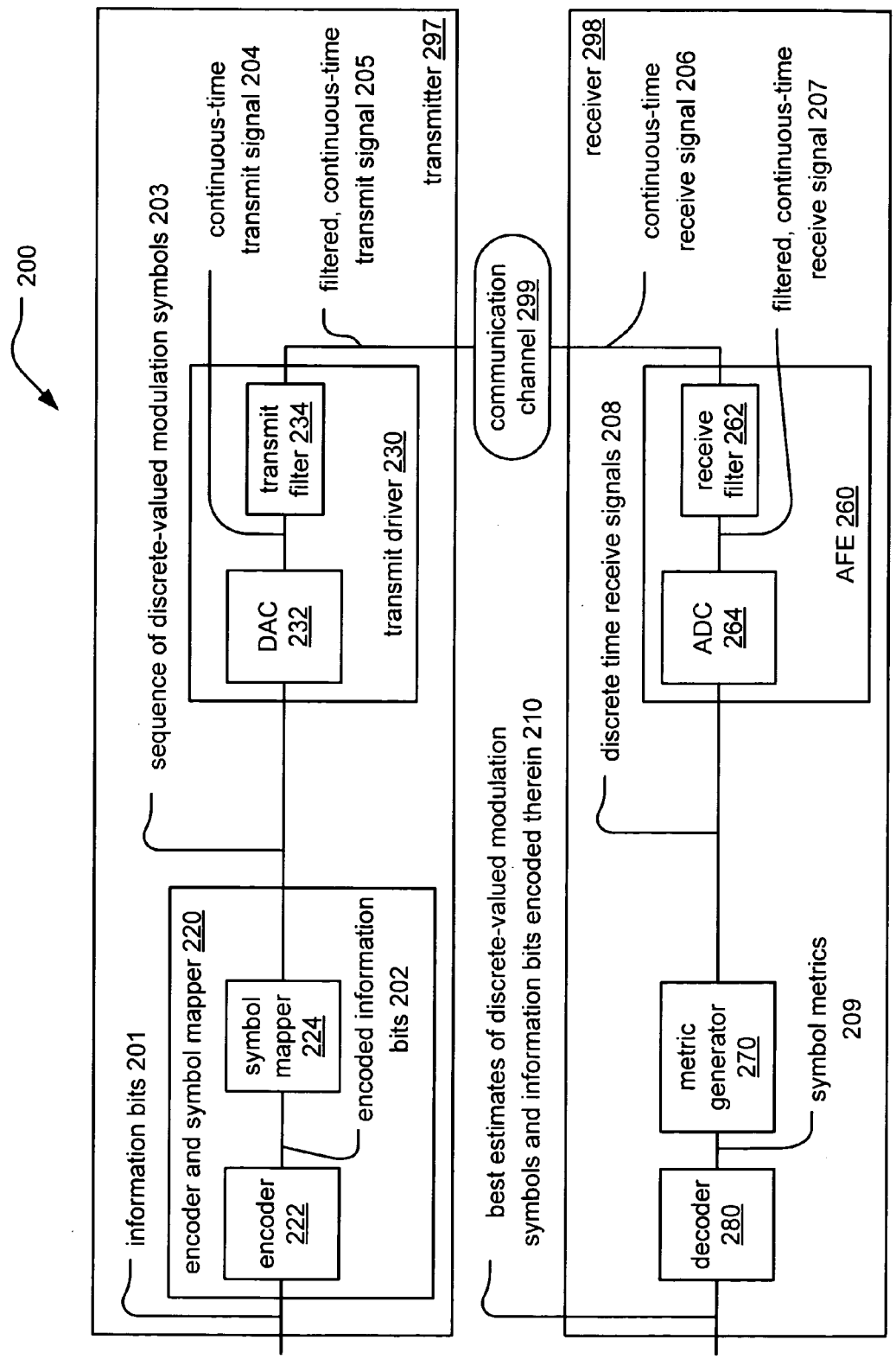

FIG. 1 and FIG. 2 are diagrams illustrating various embodiments of communication systems, 100 and 200, respectively.

Referring to FIG. 1, this embodiment of a communication system 100 is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199. In some embodiments, either of the communication devices 110 and 120 may only include a transmitter or a receiver. There are several different types of media by which the communication channel 199 may be implemented (e.g., a satellite communication channel 130 using satellite dishes 132 and 134, a wireless communication channel 140 using towers 142 and 144 and/or local antennae 152 and 154, a wired communication channel 150, and/or a fiber-optic communication channel 160 using electrical to optical (E/O) interface 162 and optical to electrical (O/E) interface 164)). In addition, more than one type of media may be implemented and interfaced together thereby forming the communication channel 199.

To reduce transmission errors that may undesirably be incurred within a communication system, error correction and channel coding schemes are often employed. Generally, these error correction and channel coding schemes involve the use of an encoder at the transmitter and a decoder at the receiver.

Referring to the communication system 200 of FIG. 2, at a transmitting end of a communication channel 299, information bits 201 are provided to a transmitter 297 that is operable to perform encoding of these information bits 201 using an encoder and symbol mapper 220 (which may be viewed as being distinct functional blocks 222 and 224, respectively) thereby generating a sequence of discrete-valued modulation symbols 203 tat is provided to a transmit driver 230 that uses a DAC (Digital to Analog Converter) 232 to generate a continuous-time transmit signal 204 and a transmit filter 234 to generate a filtered, continuous-time transmit signal 205 that substantially comports with the communication channel 299. At a receiving end of the communication channel 299, continuous-time receive signal 206 is provided to an AFE (Analog Front End) 260 that includes a receive filter 262 (that generates a filtered, continuous-time receive signal 207) and an ADC (Analog to Digital Converter) 264 (that generates discrete-time receive signals 208). A metric generator 270 calculates symbol metrics 209 that are employed by a decoder 280 to make best estimates of the discrete-valued modulation symbols and information bits encoded therein 210.

The communication devices of either of the previous embodiments can be implemented to include various decoding aspects described herein. In addition, several of the following Figures describe other and particular embodiments (some in more detail) that may be used to support the devices, systems, functionality and/or methods that may be implemented to perform decoding of LDPC codes signals. Before more details are provided below, a general description of LDPC codes is provided.

Several of the following Figures describe other and particular embodiments (some in more detail) that may be used to support the devices, systems, functionality and/or methods that may be implemented to perform decoding of LDPC coded signals. Before more details are provided below, a general description of LDPC codes is provided.

Figure 3:
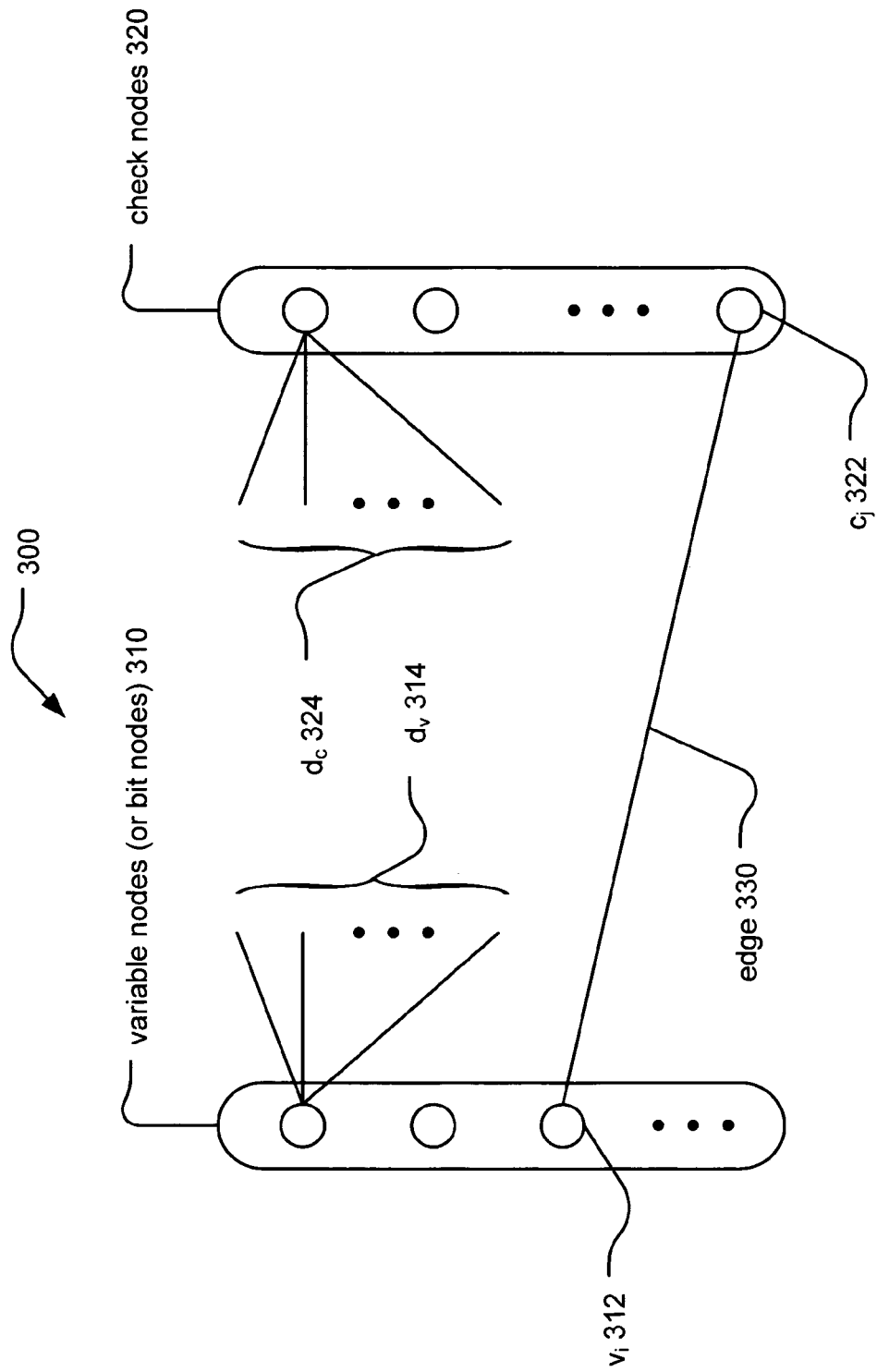
FIG. 3 illustrates an embodiment of an LDPC (Low Density Parity Check) code bipartite graph.
Figure 4:
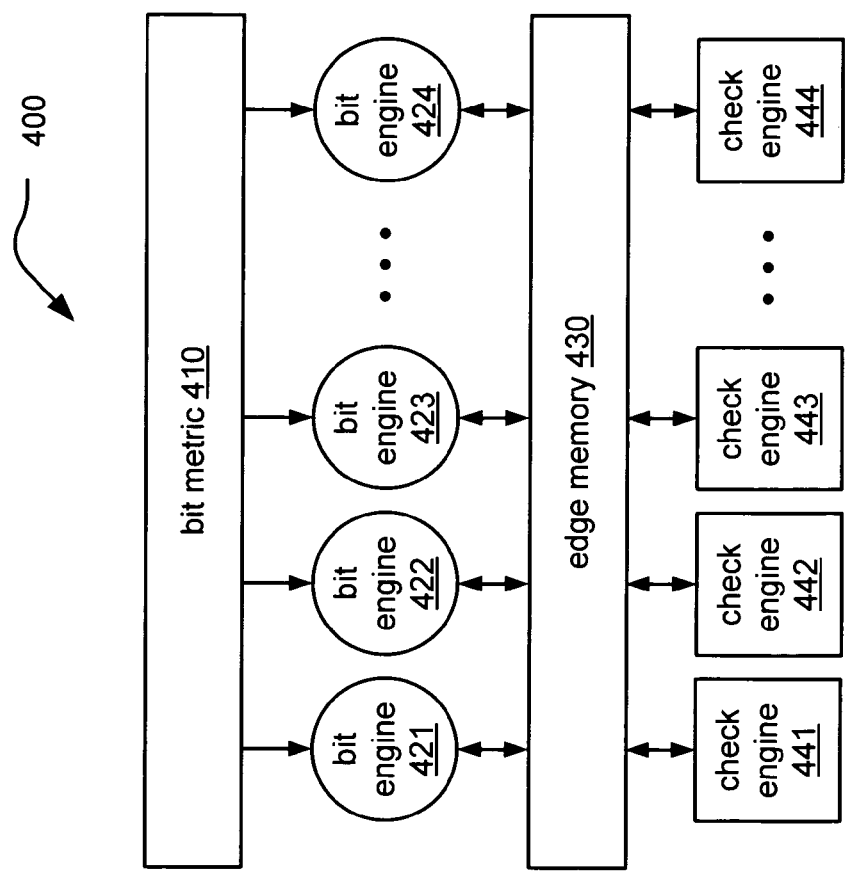
FIG. 4 illustrates a prior art embodiment of MP (Message Passing) decoding functionality.

FIG. 3 is a diagram illustrating an embodiment of an LDPC (Low Density Parity Check) code bipartite graph 300. In the art, an LDPC bipartite graph may also sometimes be referred to as a Tanner graph. An LDPC code may be viewed as being a code having a binary parity check matrix such that nearly all of the elements of the matrix have values of zeroes (e.g., the binary parity check matrix is sparse). For example, H= $(h_{i,j})_{M \times N}$ may be viewed as being a parity check matrix of an LDPC code with block length N.

The number of 1's in the i-th column of the parity check matrix may be denoted as $d_v(i)$, and the number of 1's in the j-th row of the parity check matrix may be denoted as $d_c(j)$. If $d_v(i)=d_v$ for all i, and $d_c(j)=d_c$ for all j, then the LDPC code is called a $(d_v, d_c)$ regular LDPC code, otherwise the LDPC code is called an irregular LDPC code.

LDPC codes were introduced by R. Gallager in [1] referenced below and by M. Luby et al. in [2] also referenced below.

[1] R. Gallager, *Low-Density Parity-Check Codes*, Cambridge, Mass.: MIT Press, 1963.

[2] M. Luby, M. Mitzenmacher, M. A. Shokrollahi, D. A. Spielman, and V. Stemann, "Practical Loss-Resilient Codes", *Proc. 29$^{th}$ Symp. on Theory of Computing*, 1997, pp. 150-159.

A regular LDPC code can be represented as a bipartite graph 300 by its parity check matrix with left side nodes representing variable of the code bits (or alternatively as the "variable nodes" (or "bit nodes") 310 in a bit decoding approach to decoding LDPC coded signals), and the right side nodes representing check equations (or alternatively as the "check nodes" 320). The bipartite graph 300 of the LDPC code defined by H may be defined by N variable nodes (e.g., N bit nodes) and M check nodes. Every variable node of the N variable nodes 310 has exactly $d_v(i)$ edges (an example edge shown using reference numeral 330) connecting the bit node, $v_i$ 312, to one or more of the check nodes (within the M check nodes). The edge 310 is specifically shown as connecting from the bit node, $v_i$ 312, to the check node, $c_j$ 322. This number of $d_v$ edges (shown as $d_v$ 314) may be referred to as the degree of a variable node i. Analogously, every check node of the M check nodes 1520 has exactly $d_c(j)$ edges (shown as $d_c$ 324) connecting this node to one or more of the variable nodes (or bit nodes) 310. This number of edges, $d_c$, may be referred to as the degree of the check node j.

An edge 330 between a variable node $v_i$ (or bit node $b_i$) 312 and check node $c_j$ 322 may be defined by $e=(i, j)$. However, on the other hand, given an edge $e=(i, j)$, the nodes of the edge may alternatively be denoted as by $e=(v(e),c(e))$ (or $e=(b(e), c(e))$). Given a variable node $v_i$ (or bit node $b_i$), one may define the set of edges emitting from the node $v_i$ (or bit node $b_i$) by $E_v(i)=\{e|v(e)=i\}$ (or by $E_b(i)=\{e|b(e)=i\}$). Given a check node $c_j$, one may define the set of edges emitting from the node $c_j$ by $E_c(j)=\{e|c(e)=j\}$. Continuing on, the derivative result will be $|E_v(i)|=d_v$ (or $|E_b(i)|=d_b$) and $|E_c(j)|=d_c$.

Generally speaking, any codes that can be represented by a bipartite graph may be characterized as graph codes. It is also noted that an irregular LDPC code may also described using a bipartite graph. However, the degree of each set of nodes within an irregular LDPC code may be chosen according to some distribution. Therefore, for two different variable nodes, $v_{i_1}$ and $v_{i_2}$, of an irregular LDPC code, $|E_v(i_1)|$ may not equal to $|E_v(i_2)|$. This relationship may also hold true for two check nodes. The concept of irregular LDPC codes was originally introduced within M. Luby et al. in [2] referenced above.

Figure 5:
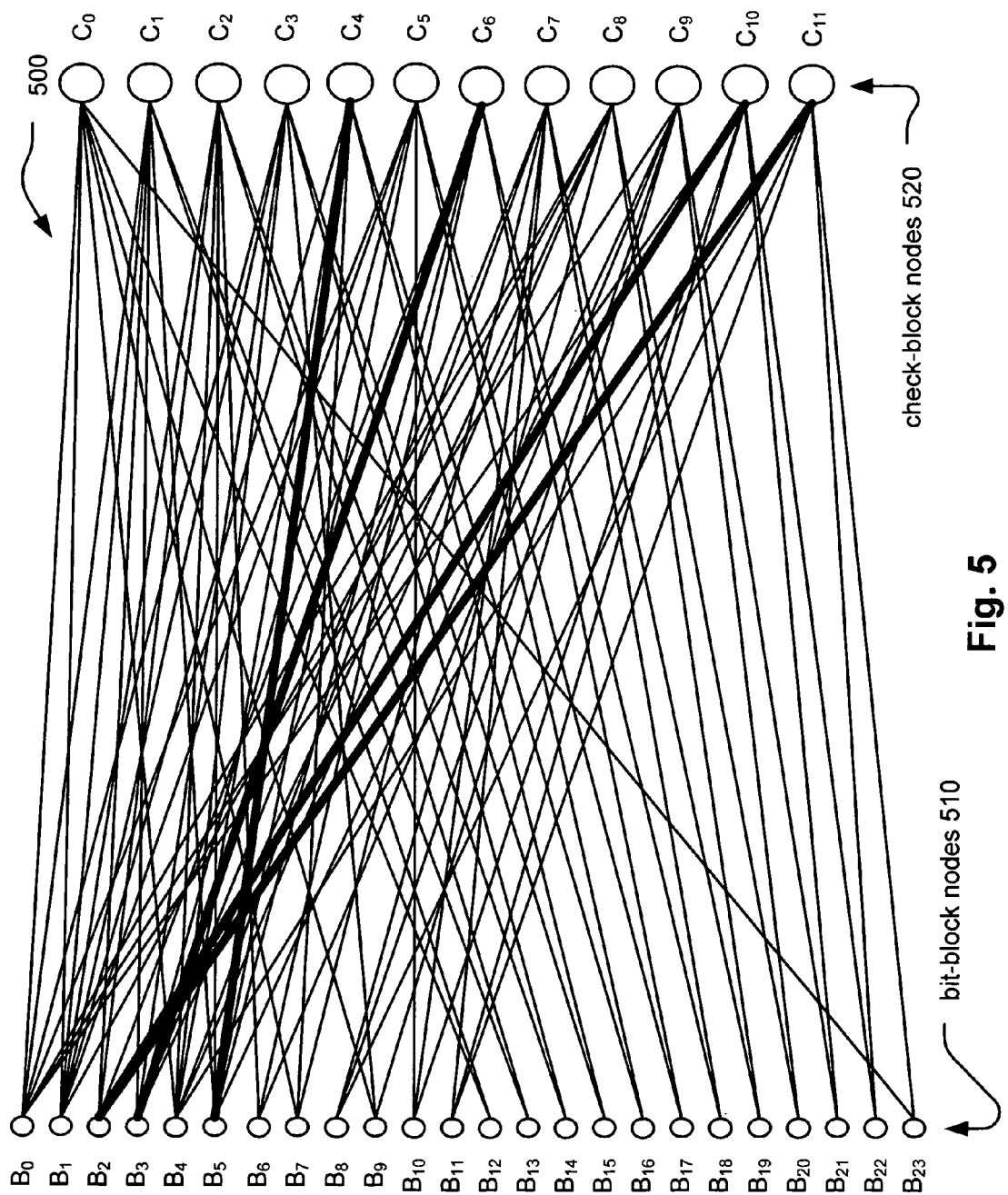
FIG. 5 illustrates an embodiment of an LDPC block-bipartite graph of a rate ½ parallel-block LDPC code with block size of 1248 bits and 624 check equations.
Figure 6:
FIG. 6 illustrates a table showing permutations for all edges of the LDPC block-bipartite graph of the FIG. 5.

It is noted that the decoding aspects presented herein are operable to accommodate both regular LDPC codes and irregular LDPC codes (e.g., as FIG. 5 and FIG. 6 depict).

The LLR (Log-Likelihood Ratio) decoding approach of LDPC codes may be described generally as follows: the probability that a bit within a received vector in fact has a value of 1 when a 1 was actually transmitted is calculated. Similarly, the probability that a bit within a received vector in fact has a value of 0 when a 0 was actually transmitted is calculated. These probabilities are calculated using the LDPC code's parity check matrix that is used to check the parity of the received vector. The LLR is the logarithm of the ratio of these two calculated probabilities. This LLR gives a measure of the degree to which the communication channel over which a signal is transmitted may undesirably affect the bits within the vector.

The LLR decoding of LDPC codes may be described mathematically as follows:

Beginning with $C=\{v|v=(v_0, \ldots, v_{N-1}), vH^T=0\}$ being an LDPC code and viewing a received vector, $y=(y_0, \ldots, y_{N-1})$, within the sent signal having the form of $((-1)^{v_0}, \ldots, (-1)^{v_{N-1}})$ then the metrics of the channel may be defined as $p(y_i|v_i=0)$, $p(y_i|v_i=1)$, $i=0, \ldots, N-1$. The LLR of a metric, $L_{metric}(i)$, will then be defined as follows:

$$L_{metric}(i) = \ln \frac{p(y_i \mid v_i = 0)}{p(y_i \mid v_i = 1)}$$

It is noted than "ln," as depicted herein within various mathematical expressions, refers to the natural logarithm having base e.

For every variable node $v_i$, its LLR information value will then be defined as follows:

$$\ln \frac{p(v_i = 0 \mid y_i)}{p(v_i = 1 \mid y_i)} = L_{metric}(i) + \ln \frac{p(v_i = 0)}{p(v_i = 1)}$$

Since the variable node, $v_i$, is in an LDPC codeword, then the value of the ratio of these values, $$\ln \frac{p(v_i = 0)}{p(v_i = 1)},$$

may be replaced by the following:

$$\ln \frac{p(v_i = 0, vH^T = 0 \mid y)}{p(v_i = 1, vH^T = 0 \mid y)} = \sum_{(i,j) \in E_v(i)} \ln \frac{p(v_i = 0, vh_j^T = 0 \mid y)}{p(v_i = 1, vh_j^T = 0 \mid y)}$$

where $E_v(i)$ is a set of edges starting with $v_i$ as defined above.

When performing the BP (Belief Propagation) decoding approach in this context, then the value of ln $$\frac{p(v_i = 0, vh_j^T = 0 \mid y)}{p(v_i = 1, vh_j^T = 0 \mid y)}$$

may be replaced by the following relationship $$L_{check}(i, j) = \ln \frac{p\left(\sum_{e \in E_c(j) \setminus \{(i,j)\}} v_{v(e)} = 0 \mid y\right)}{p\left(\sum_{e \in E_c(j) \setminus \{(i,j)\}} v_{v(e)} = 1 \mid y\right)}$$

$L_{check}(i, j)$ is called the EXT (extrinsic) information of the check node $c_j$ with respect to the edge (i,j). In addition, it is noted that $e \in E_c(j) \setminus \{(i, j)\}$ indicates all of the edges emitting from check node $c_j$ except for the edge that emits from the check node $c_j$ to the variable node $v_i$. Extrinsic information values may be viewed as those values that are calculated to assist in the generation of best estimates of actual info bit values within a received vector. Also in a BP approach, then the extrinsic information of the variable node $v_i$ with respect to the edge (i,j) may be defined as follows:

$$L_{var}(i, j) = L_{metric}(i) + \sum_{(i,k) \in E_v(i) \setminus \{(i,j)\}} L_{check}(i, k).$$

As alluded to above, it is noted that the parity check matrix, H, of an LDPC code may have the following form.

$$H = \begin{bmatrix} H_{1,1} & \cdots & H_{1,m} \\ \vdots & \ddots & \vdots \\ H_{L,1} & \cdots & H_{L,m} \end{bmatrix} \quad \text{(EQ 3)}$$

In this form, it is noted that each of the sub-matrices, $H_{i,j}$, of the parity check matrix, H, is either (1) a p×p matrix in which all elements are either 0, (2) a p×p matrix that is a permutation of the identity matrix, or (3) the addition resultant of several permuted identity matrices.

The parallel-block LDPC code disclosed within the U.S. Utility patent application Ser. No. 10/851,614, which has been incorporated herein by reference in their entirety and made part of the present U.S. Utility Patent Application for all purposes, as indicated above, is one such LDPC code that includes the characteristics described just above.

An exemplary rate ½ LDPC code with a block size of 1248 bits and 624 check equations with p=52, m=24, and L=12 may be considered. This LDPC block-bipartite graph is provided within and described with respect to the following diagram.

FIG. 5 illustrates an embodiment of an LDPC block-bipartite graph 500 of a rate ½ parallel-block LDPC code with block size of 1248 bits and 624 check equations. In the graph, a dark edge represents the parallel edges. This diagram considers an example rate ½ LDPC code with bit length 1248 and 624 check equations. Let p=52 as mentioned above. Then there are 24 bit-blocks (shown as $B_0, B_1, B_2, \ldots, B_{23}$) and 12 check-blocks (shown as $C_0, C_1, C_2, \ldots, C_{11}$). The first 12 bit-blocks are $B_i=\{52i, 52i+1, \ldots, 52(i+1)i-1\}$, i=0, \ldots, 11. The next 12 bit-blocks are characterized as $B_j=\{52j, 52j+12, 52j+24, \ldots, 52j+51\times12\}$, j=0, \ldots, 11. In this diagram, a dark edge represents the parallel edges. The permutation, $\pi_{i,j}$, of every edge is a cyclical shift which is listed below within the table of the FIG. 6.

FIG. 6 illustrates a table, shown using reference numeral 600, showing permutations for all edges of the LDPC block-bipartite graph of the FIG. 5. Again, the permutation, $\pi_{i,j}$, of every edge is a cyclical shift as indicated in this table of this diagram. In the table shown in this diagram, if there is no number in a given cell, this indicates that there is no connection between those particular nodes (e.g., no connection between the bit-block nodes and the check-block nodes), otherwise the number represents the depth of the cyclical shift. The two numbers represent the two cyclic shifts for parallel edges (i.e., dark edges represent the parallel edges).

In the U.S. Utility patent application Ser. No. 10/851,614, some examples of parallel-block LDPC codes have been presented (including regular LDPC codes where the each individual bit node is considered as being a bit-block node and each check node is considered as being a check-block node— e.g., each block has only one element). In addition, the LDPC codes used in the European standard of DVB-2 represent yet another example of parallel-block LDPC codes that may be decoded using embodiments of the novel approaches presented herein. These LDPC codes are described in the DVB-S2 (i.e., DVB-Satellite Version 2) standard and draft standard referenced described above.

More examples of parallel-block LDPC codes can be found in the following 3 references:

[3] H. Zhong and T. Zhang, "Design of VLSI implementation-oriented LDPC codes," *IEEE Semiannual Vehicular Technology Conference (VTC)*, October 2003.

[4] S. J. Johnson and S. R. Weller, "Quasi-cyclic LDPC codes from difference families," *3rd AusCTW*, Canberra, Australia, Feb. 4-5, 2002.

[5] F. Verdier and D. Declercq, "A LDPC parity check matrix construction for parallel hardware decoding," *3rd International Symposium on Turbo-Codes & Related Topics Brest*, France, September 2003.

Every single-valued entry (e.g. n) within the table, shown using reference numeral 800, represents a 52×52 matrix, and this number n indicates that the entry is an n-cyclic shifted identity matrix. Alternatively, every dual-valued entry (e.g. x, y) within the table, shown using reference numeral 800, indicates that the two cyclic shifted identity matrices are added together to form that respective resultant.

When considering such parallel-block LDPC codes as these and others, it is noted that the LMP decoding approach referred to above is simply incapable to decode such LDPC codes.

However, the novel approach of decoding presented herein is capable to decode such LDPC codes. Not only may such LDPC codes be in fact decoded (that which is not possible within the context of the LMP decoding approach), but the decoding processing may converge to a solution relatively quickly and also may provide relatively good performance (e.g. low BER (Bit Error Rate) in terms of SNR (Signal to Noise Ratio)) may also be achieved.

A novel decoding approach for decoding LDPC coded signals (including those having characteristics of parallel-block LDPC codes) is presented herein. In describing this decoding approach, the same notation is employed as that which is employed above. This decoding approach may generally be referred to as AMP (Accelerated Message Passing) decoding processing. Various embodiments of such AMP decoding processing are provided below.

Figure 7:
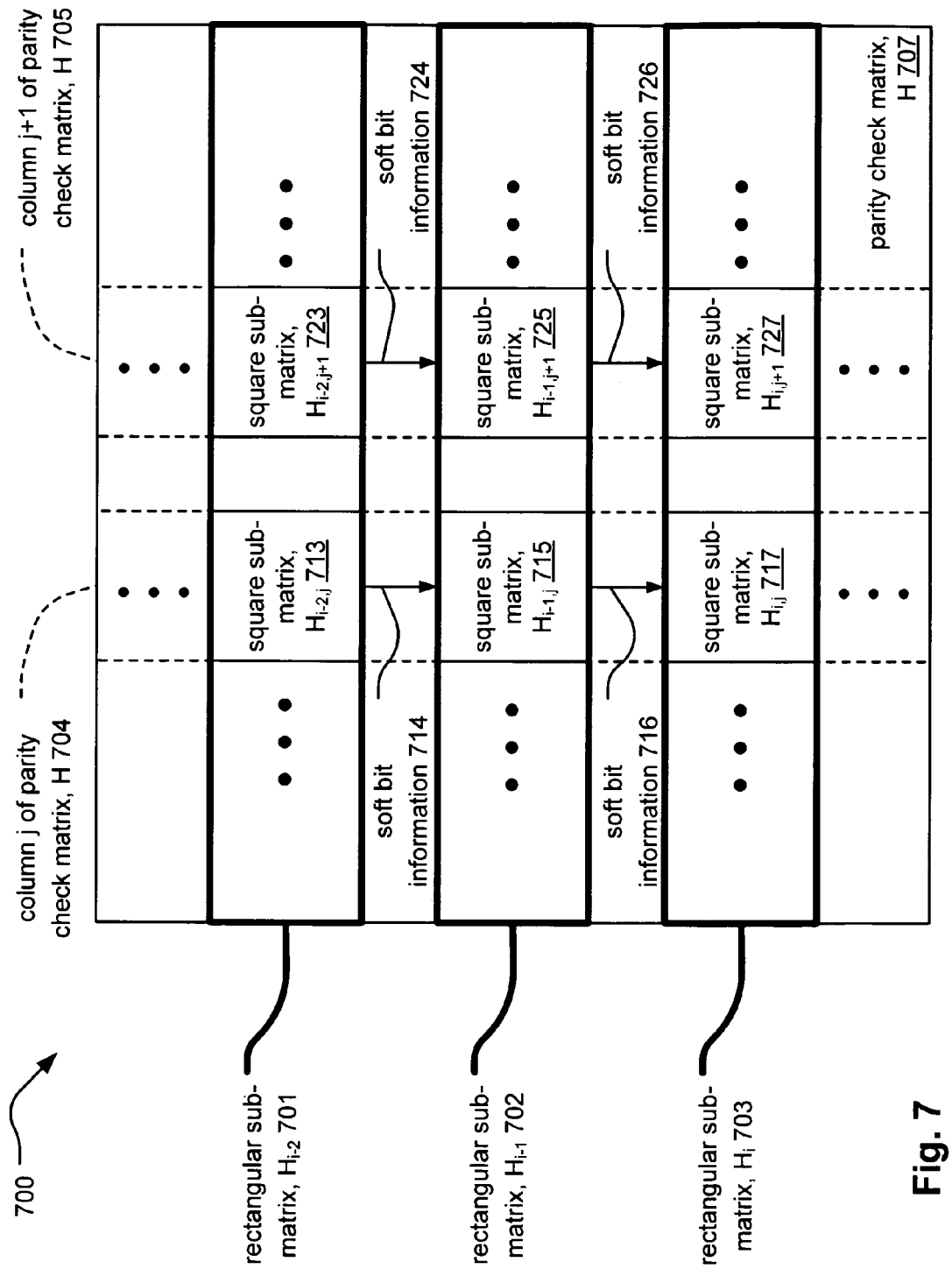
FIG. 7 illustrates an embodiment of various components of a parity check matrix, H.

FIG. 7 illustrates an embodiment 700 of various components of a parity check matrix, H. In this embodiment 700, the parity check matrix H 707 is shown as having a plurality of rectangular sub-matrices (shown as . . . , rectangular sub-matrix $H_{i-2}$ 701, rectangular sub-matrix $H_i$ 702, rectangular sub-matrix $H_i$ 703, and so on . . . ). The parity check matrix H 707 may be viewed as having the following format:

$$H = \begin{bmatrix} \vdots \\ H_{i-2} \\ H_{i-1} \\ H_i \\ \vdots \end{bmatrix}, \text{ or } H = [\cdots \ H_{i-2} \ H_{i-1} \ H_i \ \cdots]^T.$$

In addition, each of the plurality of rectangular sub-matrices includes a plurality of square sub-matrices. The plurality of square sub-matrices can be viewed as being arranged into a plurality of columns. Two of the columns are depicted as column j of parity check matrix, H, 704 and column j+1 of parity check matrix, H, 705. The column j of parity check matrix, H, 704 is shown as having its own corresponding plurality of square sub-matrices (shown as . . . , a square sub-matrix $H_{i-2,j}$ 713, a square sub-matrix $H_{i-1,j}$ 715, a square sub-matrix $H_{i,j}$ 717, and so on . . . ). The column j+1 of parity check matrix, H, 705 is shown as having its own corresponding plurality of square sub-matrices (shown as . . . , a square sub-matrix $H_{i-2,j+1}$ 723, a square sub-matrix $H_{i-1,j+1}$ 725, a square sub-matrix $H_{i,j+1}$ 727, and so on . . . ).

When decoding is performed using the parity check matrix H 707, it is performed in a top down approach, in that, the columns including each of the square sub-matrices are decoding starting from the top. When a first square sub-matrix is decoded thereby generating its corresponding soft bit information, that soft bit information is then used when decoding a second square sub-matrix situated just below the first square sub-matrix. This processing continues on down through each of the columns of the parity check matrix H 707. This approach provides for very fast decoding processing, in that, immediately when soft bit information is available with respect to one square sub-matrix, it is passed forward for use when decoding a subsequent square sub-matrix below it in the same column.

For an example shown in this embodiment 700, when the column j of parity check matrix, H, 704 is being decoded, the square sub-matrix $H_{i-2,j}$ 713 is decoded using soft bit information provided to it from a square sub-matrix situated above it (if one exists). It is noted that for each first non-zero square sub-matrix in each column of the parity check matrix, H, 704, the soft bit information that is employed as its input is the bit metric information (i.e., the initially received LLR) corresponding to that bit during the first decoding iteration. However, this is only for the first decoding iteration. For decoding iterations after the first iteration, each first non-zero square sub-matrix in each column of the parity check matrix, H, 704, uses the soft bit information that is generated by the last non-zero square sub-matrix in each column of the parity check matrix, H, 704, as its corresponding input.

For example, if the square sub-matrix $H_{i-2,j}$ 713 were the first non-zero square sub-matrix of this column of the parity check matrix H 707, then its initial conditions for decoding would be the bit metric information (i.e., the initially received LLR) corresponding to that bit. The soft bit information 714 that is generated when decoding the square sub-matrix $H_{i-2,j}$ 713 is passed to and used in the decoding processing of the square sub-matrix $H_{i-1,j}$ 715 to generate soft bit information 716.

Analogously, the soft bit information 716 that is generated when decoding the square sub-matrix $H_{i-1,j}$ 715 is passed to and used in the decoding processing of the square sub-matrix $H_{i,j}$ 717 to generate soft bit information that may be used for any additional square sub-matrices within the column j of parity check matrix, H, 704 that are situated below the square sub-matrix $H_{i,j}$ 717. The processing of the column j+1 of parity check matrix, H, 705 is analogous to this processing of the column j of parity check matrix, H, 704.

As can be seen, the decoding processing of the parity check matrix H 707 is performed using the decoded soft bit information that is essentially cascaded down throughout each of the columns therein when individually decoding each of these square sub-matrices. Using this approach, the decoding processing can converge on a solution in much fewer decoding iterations than within other decoding approaches. When performing as many decoding iterations as may be employed within other approaches, a better performance may be achieved. This allows a designer great flexibility and improvement of other decoding approaches, in that, an embodiment of this decoding approach presented herein may be implemented to provide for better performance (using a comparable number of decoding iterations) or to provide a means in which to achieve comparable performance (while using a much fewer number of decoding iterations).

Figure 8:
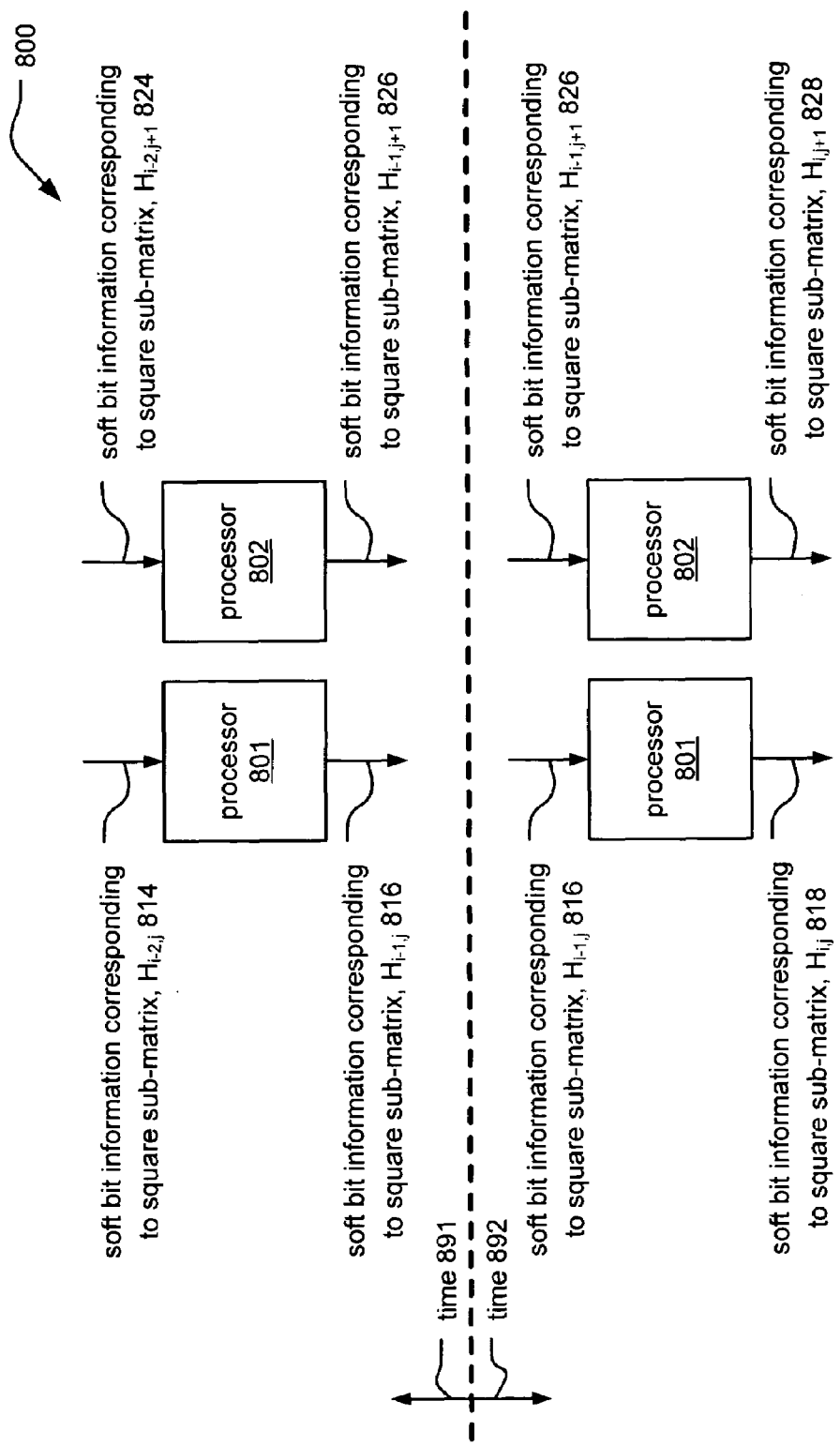
FIG. 8 illustrates an embodiment of decoding processing to generate soft bit information for current square sub-matrices of a parity check matrix, H, using soft bit information from previous square sub-matrices of the parity check matrix, H.

FIG. 8 illustrates an embodiment 800 of decoding processing to generate soft bit information for current square sub-matrices of a parity check matrix, H, using soft bit information from previous square sub-matrices of the parity check matrix, H. This embodiment 800 shows a parallel arrangement in which a plurality of processors is operable to perform the decoding processing of each of the square sub-matrices of a parity check matrix, H.

For example, during a time 891, a processor 801 receives soft bit information corresponding to square sub-matrix $H_{i-2,j}$ 814. The processor 801 then proceeds to decode a square sub-matrix $H_{i-1,j}$ using this received soft bit information corresponding to square sub-matrix $H_{i-2,j}$ 814. The processor 801 then generates soft bit information corresponding to square sub-matrix $H_{i-1,j}$ 816.

Analogously, during the time 891, a processor 802 receives soft bit information corresponding to square sub-matrix $H_{i-1,j+1}$ 824. The processor 802 then proceeds to decode a square sub-matrix $H_{i-1,j+1}$ using this received soft bit information corresponding to square sub-matrix $H_{i-1,j+1}$ 824. The processor 802 then generates soft bit information corresponding to square sub-matrix $H_{i-1,j+1}$ 826.

The very same processors 801 and 802 are then re-employed to decode the subsequent square sub-matrices in each of these 2 respective columns of the parity check matrix, H.

During a time 892, the processor 801 receives soft bit information corresponding to square sub-matrix $H_{i-1,j}$ 816. The processor 801 then proceeds to decode a square sub-matrix $H_{i,j}$ using this received soft bit information corresponding to square sub-matrix $H_{i-1,j}$ 816. The processor 801 then generates soft bit information corresponding to square sub-matrix $H_{i,j}$ 818.

Analogously, during the time 892, the processor 802 receives soft bit information corresponding to square sub-matrix $H_{i-1,j+1}$ 826. The processor 802 then proceeds to decode a square sub-matrix $H_{i,j+1}$ using this received soft bit information corresponding to square sub-matrix $H_{i-1,j+1}$ 826. The processor 802 then generates soft bit information corresponding to square sub-matrix $H_{i,j+1}$ 828.

In an alternative embodiment, a singular processor could be used to decode each of the columns of the parity check matrix, H, serially. For example, each of the square sub-matrices of a first column of the parity check matrix, H, could be decoded in a first step, and each of the square sub-matrices of a second column of the parity check matrix, H, could be decoded in a second step, and so on.

Figure 9:
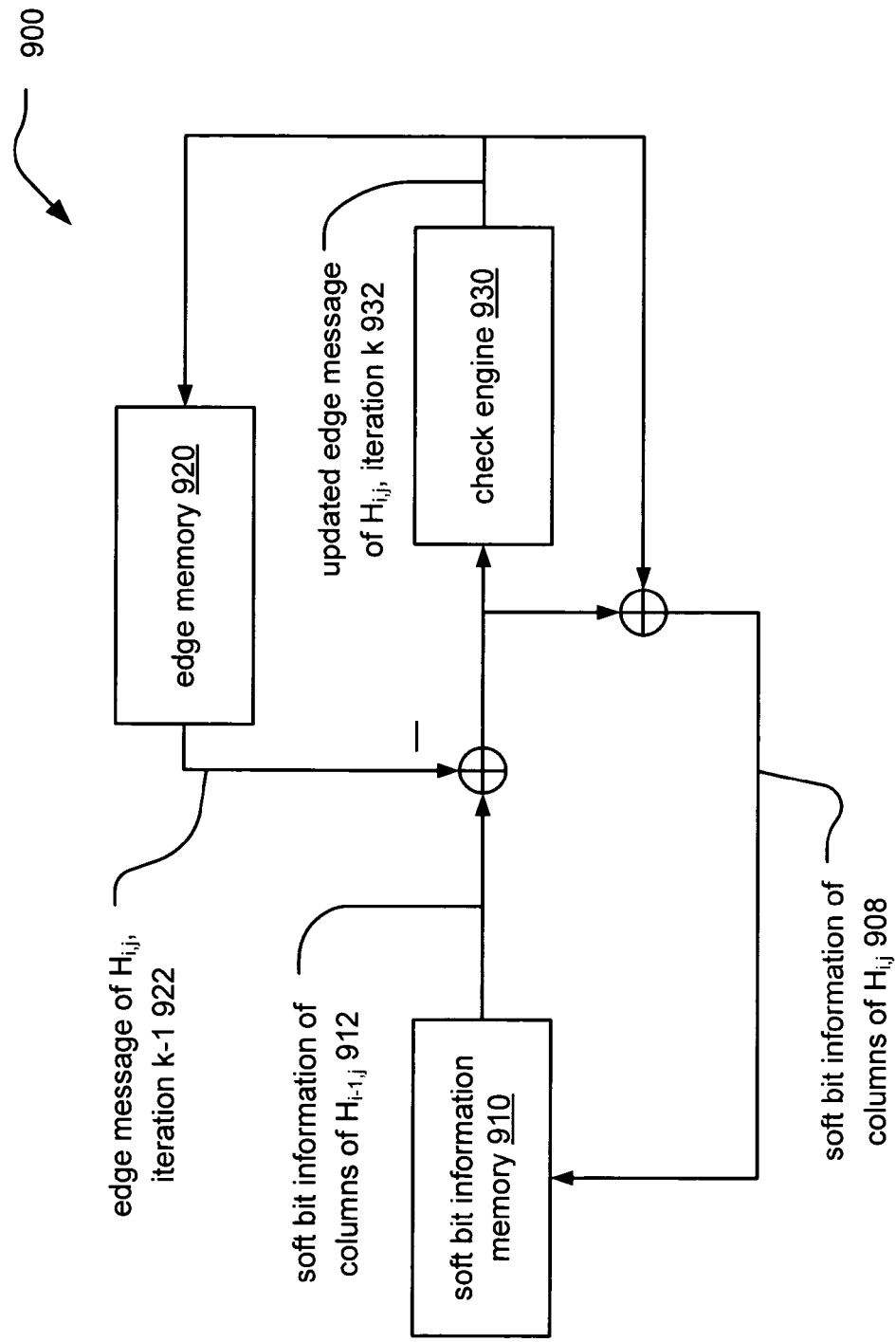
FIG. 9 illustrates an embodiment of soft bit information update processing for the sub-matrices, $H_{i,j}$, of the parity check matrix, H, when it has column weight equal to 1.
Figure 10:
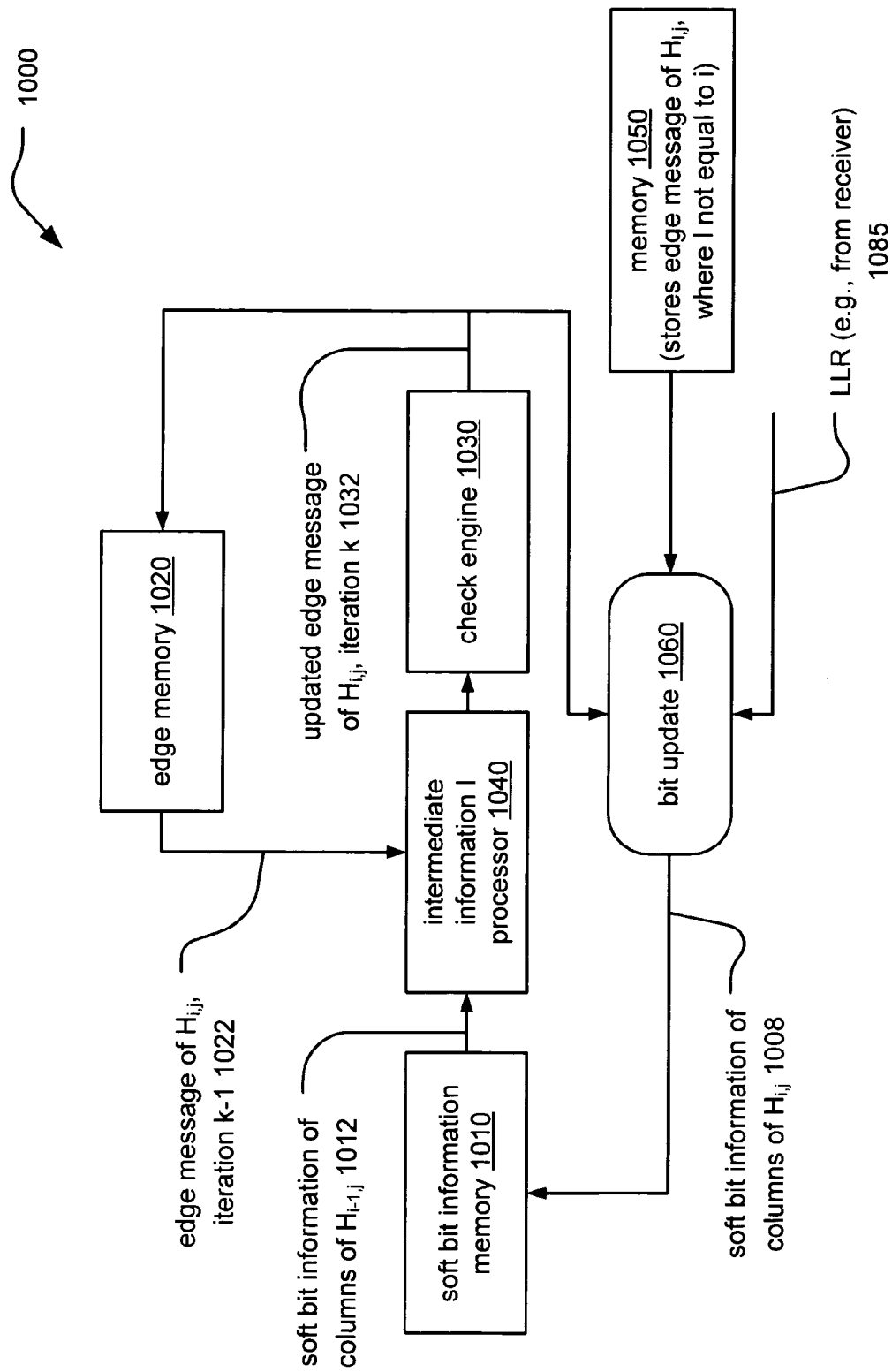
FIG. 10 illustrates an embodiment of soft bit information update processing for the sub-matrices, $H_{i,j}$, of the parity check matrix, H, when it has column weight more than 1.
Figure 11:
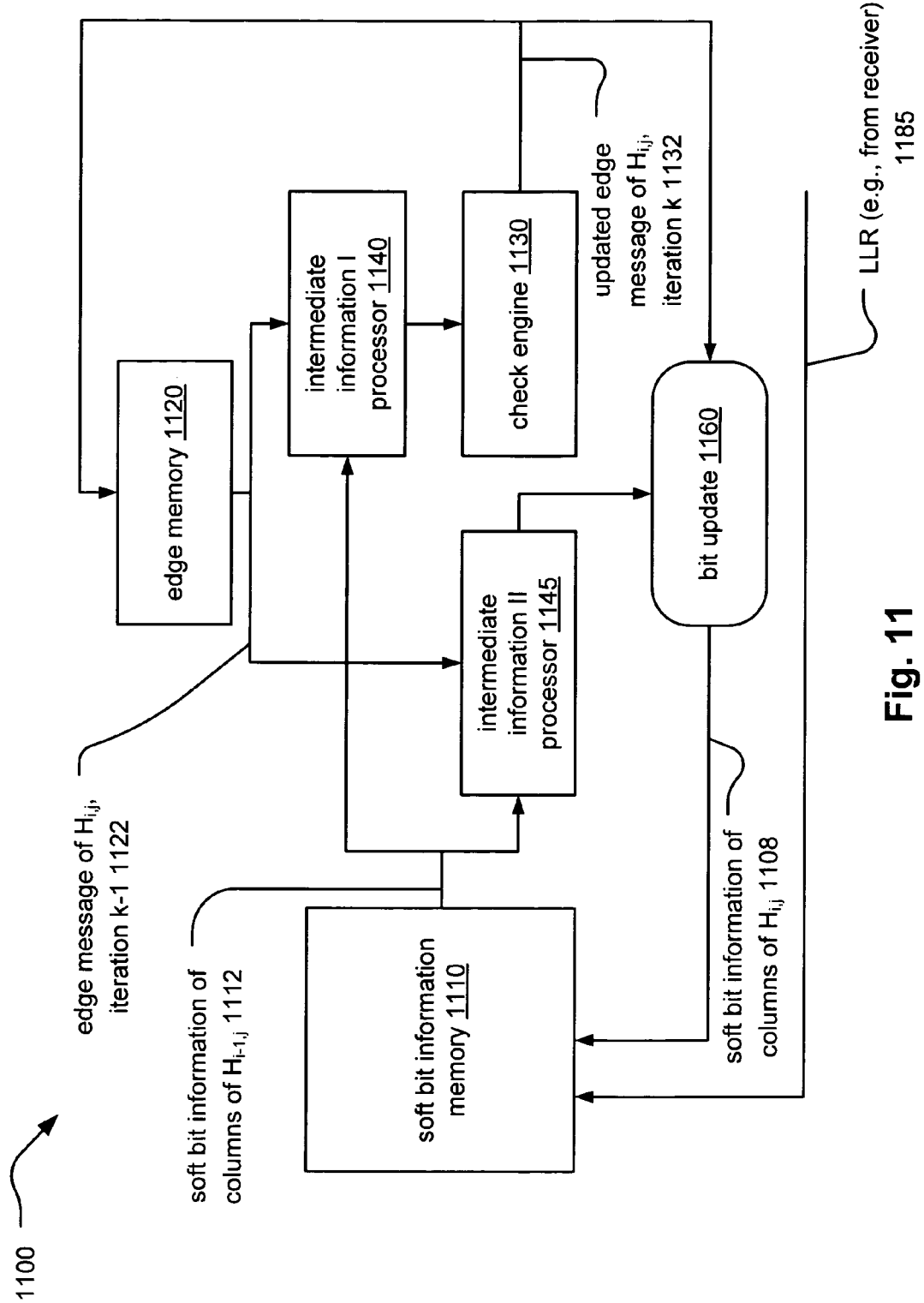
FIG. 11 illustrates an alternative embodiment of soft bit information update processing for the sub-matrices, $H_{i,j}$, of the parity check matrix, H.

The FIG. 9 and the FIG. 10 may be characterized as corresponding to various aspects of a first embodiment (e.g. AMP-I decoding processing), and the FIG. 11 may be characterized as corresponding to various aspects of a second embodiment (e.g. AMP-II decoding processing).

FIG. 9 illustrates an embodiment 900 of soft bit information update processing for the sub-matrices, $H_{i,j}$, of the parity check matrix, H, when it has column weight equal to 1.

The AMP-I decoding processing operates according to the functionality described within this diagram. For those columns of the sub-matrices, $H_{i,j}$, of the parity check matrix, H, that have column weight of 1, the soft bit information update processing operates using the functionality of FIG. 9.

During the first decoding iteration, the edge memory 920 is set to 0 ("zero"). The edge messages of $H_{i,j}$, corresponding to the decoding iteration k−1 (shown using reference numeral 922) are retrieved from an edge memory 920. These edge messages are then subtracted from soft bit information of the columns of $H_{i-1,j}$ (shown using reference numeral 912) that have been retrieved from a soft bit information memory 910 that stores them.

This subtracted resultant is then provided a check engine 930 that is operable to perform check node processing thereby updating of at least one edge message with respect to a check node thereby generated an updated edge message of $H_{i,j}$, corresponding to the decoding iteration k (shown using reference numeral 932).

The updated 1 or more updated edge message(s) of $H_{i,j}$, corresponding to the decoding iteration k (shown using reference numeral 932) is then provided both to a summing block and also back to the edge memory 920. This summing block adds the updated edge message of $H_{i,j}$, corresponding to the decoding iteration k (shown using reference numeral 932) that is provided from the check engine 930 with the subtracted resultant that was also just provided to the check engine 930.

This sum that is composed of the updated edge message of $H_{i,j}$, corresponding to the decoding iteration k (shown using reference numeral 932) and the subtracted resultant then composes the soft bit information of the columns of $H_{i,j}$ (shown using reference numeral 908) which is then provided to the soft bit information memory 910 to allow retrieval during subsequent decoding of the next rectangular sub-matrices (e.g., rectangular sub-matrix $H_{i-2}$ 701, rectangular sub-matrix $H_i$ 702, rectangular sub-matrix $H_i$ 703 of FIG. 7).

FIG. 10 illustrates an embodiment 1000 of soft bit information update processing for the sub-matrices, $H_{i,j}$, of the parity check matrix, H, when it has column weight more than 1. This embodiment may be viewed as operating in conjunction with the embodiment 900 of the FIG. 9. For example, when a square sub-matrix, $H_{i,j}$, of the parity check matrix, H, has column weight more than 1, then the soft bit information update processing can operate using the embodiment 1000 of FIG. 10. There are some similarities between this embodiment 1000 and the embodiment 900 of the FIG. 9.

The edge messages of $H_{i,j}$, corresponding to the decoding iteration k–1 (shown using reference numeral 1022) are retrieved from an edge memory 1020. These edge messages are then provided to an intermediate information I processor 1040.

This intermediate information I processor 1040 also receives the soft bit information of the columns of $H_{i-1,j}$ (shown using reference numeral 1012) from a soft bit information memory 1010 that have been generated when decoding a previous rectangular sub-matrix $H_i$. The intermediate information I processor 1040 then calculates intermediate information using the soft bit information of the columns of $H_{i-1,j}$ (shown using reference numeral 1012), and provides this intermediate information to a check engine 1030.

The intermediate information processor 1040 is operable to compute the intermediate information, $M_1$, for every column v and every row u as follows:

$$M_1(u,v) = S_{(j-1)p+v} - M_{u,v}^{k-1}(H_{i,j}) \quad \text{(EQ 4)}$$

The check engine 1030 is operable to perform check node processing thereby updating of at least one edge message with respect to a check node thereby generated an updated edge message of $H_{i,j}$, corresponding to the decoding iteration k (shown using reference numeral 1032).

The updated 1 or more updated edge message of $H_{i,j}$, corresponding to the decoding iteration k (shown using reference numeral 1032) is then provided both to a bit update block 1060 and also back to the edge memory 1020. The bit update block 1060 is operable to calculate the next soft bit information of the columns of $H_{i,j}$ (shown using reference numeral 1008) and to provide this next soft bit information to the soft bit information memory 1010 for use in subsequent decoding of the next rectangular sub-matrices (e.g., rectangular sub-matrix $H_{i-2}$ 701, rectangular sub-matrix $H_i$ 702, rectangular sub-matrix $H_i$ 703 of FIG. 7).

The bit update block 1060 is also operable to receive the edge messages of the $H_{i,j}$ such that l≠i (e.g., l is not equal to i) that are stored in a memory 1050. In addition, the bit update block 1060 is also operable to receive the LLR (Log-Likelihood Ratio) (shown using reference numeral 1085). This LLR information 1085 may be provided from the receiver front end portion of a communication device employing this embodiment 1000 of decoding processing. For example, a receiver portion of such a communication device may do a variety of pre-processing operations which can include frequency down conversion, sampling, baseband processing, metric generation, and calculation of LLR information. The bit update block 1060 is operable to calculate and provide the next soft bit information of the columns of $H_{i,j}$ (shown using reference numeral 1008) which is then provided to the soft bit information memory 1010 to allow retrieval during subsequent decoding of the next rectangular sub-matrices (e.g., rectangular sub-matrix $H_{i-2}$ 701, rectangular sub-matrix $H_i$ 702, rectangular sub-matrix $H_i$ 703 of FIG. 7).

The bit node processing indicated by the bit update block 1060 that performs "bit update" can be carried out as described below in this embodiment. With respect to the previous iteration (i.e., k–1), the edge messages with respect to the check nodes (sometimes referred to as $\text{Medge}_c$) can also be depicted as $M_{u,v}^{k-1}(H_{i,j})$ (for ease of the reader's understanding with respect to the following equations). With respect to the current iteration (i.e., k), the edge messages with respect to the check nodes (again, sometimes previously referred to as $\text{Medge}_c$) may be depicted as $M_{u,v}^{k}(H_{i,j})$. Moreover, the LLR (Log-Likelihood Ratio), which can be provided from a communication device that is operable to calculate metrics of received symbols that correspond to a particular bit, b, may be depicted as follows: $\text{met}_b$. Then, the soft bit information, $S_{(j-1)p+v}$, may be represented as follows:

$$S_{(j-1)p+v} = \text{met}_b + \sum_{u=1}^{p} M_{u,v}^{k}(H_{i,j}) + \sum_{l \neq i} M_{u,v}^{k-1}(H_{l,j}), \quad \text{(Eq 5)}$$

for $v = 1, \ldots, p$

It is noted that the term, $$\sum_{u=1}^{p} M_{u,v}^{k}(H_{i,j}),$$

includes the output from the check engine 1030 and the term, $$\sum_{l \neq i} M_{u,v}^{k-1}(H_{i,j}),$$

includes the terms retrieved from the memory 1050. Again, the term, $\text{met}_b$, can be retrieved from a receiver portion of such a communication device. It is also noted that if the (u,v) entry of the sub-matrix, $H_{k,l}$, is 0 then there is no $M_{u,v}(H_{k,l})$.

As mentioned above, the FIG. 11 (which is described in more detail below) may be viewed as corresponding to various aspects of a second embodiment of decoding processing presented herein (e.g. AMP-II decoding processing).

FIG. 11 illustrates an alternative embodiment of soft bit information update processing 1100 for the square sub-matrices, $H_{i,j}$, of the parity check matrix, H. This embodiment uses a similar notation as provided above. This embodiment 1100 supposes that the square sub-matrix, $H_{i,j}$, has a weight of w. At the l-th column, the matrix entries are as follows: $h_{r_1,l} = h_{r_2,l} = \ldots = h_{r_w,l} = 1$. According to this, the sub-block processing according to the AMP-II decoding processing may be performed according to the embodiment 1100 of the FIG. 11.

The edge messages of $H_{i,j}$, corresponding to the decoding iteration k–1 (shown using reference numeral 1122) are retrieved from an edge memory 1120. These edge messages are then provided to an intermediate information II processor 1145. In addition, these edge messages are also provided to an intermediate information I processor 1140.

This intermediate information I processor 1140 also receives the soft bit information of the columns of $H_{i-1,j}$ (shown using reference numeral 1112) from a soft bit information memory 1110 that have been generated when decoding a previous rectangular sub-matrix $H_i$. The intermediate information I processor 1140 then calculates first intermediate information by subtracting the soft bit information of the columns of $H_{i-1,j}$ (shown using reference numeral 1112) from the edge messages of $H_{i,j}$, corresponding to the decoding iteration k−1 (shown using reference numeral 1122), and provides this first intermediate information to a check engine 1130.

The check engine 1130 is operable to perform check node processing thereby updating of at least one edge message with respect to a check node thereby generated an updated edge message of $H_{i,j}$, corresponding to the decoding iteration k (shown using reference numeral 1132).

The updated 1 or more updated edge message of $H_{i,j}$, corresponding to the decoding iteration k (shown using reference numeral 1132) is then provided both to a bit update block 1160 and also back to the edge memory 1120. The bit update block 1160 is operable to calculate the next soft bit information of the columns of $H_{i,j}$ (shown using reference numeral 1108) and to provide this next soft bit information to the soft bit information memory 1110 for use in subsequent decoding of the next rectangular sub-matrices (e.g., rectangular sub-matrix $H_{i-2}$ 701, rectangular sub-matrix $H_i$ 702, rectangular sub-matrix $H_i$ 703 of FIG. 7) by adding the result generated by intermediate information II processor 1145 with all updated edge message of $H_{i,j}$, corresponding to the decoding iteration k (shown using reference numeral 1132).

In addition, the intermediate information II processor 1145 also receives the soft bit information of the columns of $H_{i-1,j}$ (shown using reference numeral 1112) from a soft bit information memory 1110 that have been generated during a previous iteration. The intermediate information II processor 1145 then calculates second intermediate information by subtracting all the updated edge messages of $H_{i,j}$, corresponding to the decoding iteration k (shown using reference numeral 1132) from the soft bit information of the columns of $H_{i-1,j}$, and provides this second intermediate information to the bit update block 1160.

For example, in the instance where there are 2 or more "1" values in a column of $H_{i,j}$, then the intermediate information II processor 1145 calculates the second intermediate information by subtracting all of the edge messages of $H_{i,j}$ (corresponding to the decoding iteration k−1) that correspond to each of the "1" values in the column of $H_{i,j}$ from the soft bit information for that column.

During initialization (i.e., before the first decoding iteration), the soft bit information memory 1110 is operable to receive LLR (Log-Likelihood Ratio) (shown using reference numeral 1185). Similar as described above with respect to another embodiment, this LLR information 1185 may be provided from the receiver front end portion of a communication device employing this embodiment 1100 of decoding processing. For example, a receiver portion of such a communication device may do a variety of pre-processing operations which can include frequency down conversion, sampling, baseband processing, metric generation, and calculation of LLR information.

The bit update block 1160 is operable to calculate and provide the next soft bit information of the columns of $H_{i,j}$ (shown using reference numeral 1108) which is then provided to the soft bit information memory 1110 to allow retrieval during subsequent decoding of the next rectangular sub-matrices (e.g., rectangular sub-matrix $H_{i-2}$ 701, rectangular sub-matrix $H_i$ 702, rectangular sub-matrix $H_i$ 703 of FIG. 7). The bit update block 1160 is operable to add the output from the intermediate information II processor 1145 to the updated edge messages of $H_{i,j}$ (corresponding to the decoding iteration k). For example, in the instance where there are 2 or more "1" values in a column of $H_{i,j}$, then the bit update block 1160 is operable to add the edge messages of $H_{i,j}$ (corresponding to the decoding iteration k) that correspond to each of the "1" values in the column of $H_{i,j}$ for each column.

The intermediate information I processor 1140 is operable to compute the first intermediate information, $M_I$, for every column v and every row u as follows (this is similar to the processing of the intermediate information I processor 1040 of the embodiment 1000 of the FIG. 10):

$$M_I(u,v) = S_{(j-1)p+v} - M_{u,v}^{k-1}(H_{i,j}) \qquad \text{(EQ 6)}$$

The intermediate information II processor 1145 is operable to compute, $T_I$, for every column l as follows:

$$T_l = S_{(j-1)p+v} - \sum_{j=1}^{w} M_{u_w,v}^{k-1}(H_{i,j}) \qquad \text{(EQ 7)}$$

The bit node processing indicated by the bit update block 1160 that performs "bit update" can be carried out as described below in this embodiment to calculate the soft bit information, $S_{(j-1)p+v}$.

$$S_{(j-1)p+v} = T_l + \sum_{j=1}^{w} M_{u_w,v}^{k}(H_{i,j}) \qquad \text{(EQ 8)}$$

The ability of various embodiments of the AMP decoding approach described herein to accommodate p×p sub-matrices, $H_{i,j}$, has more than one "1" value per row or per column (e.g., 2 or more) allows a designer to construct a much broader range of LDPC codes. This gives the designer more flexibility to construct a better performing code for a given application.

In this disclosure, the performance diagram is described in the context of BER (Bit Error Rate) (or alternatively BLER (Block Error Rate)) versus $E_b/N_o$ (ratio of energy per bit $E_b$ to the Spectral Noise Density $N_o$). This term $E_b/N_o$ is the measure of SNR (Signal to Noise Ratio) for a digital communication system. When looking at these performance curves, the BLER or BER may be determined for any given $E_b/N_o$ (or SNR) thereby providing a relatively concise representation of the performance of an embodiment of this decoding approach.

Figure 12:
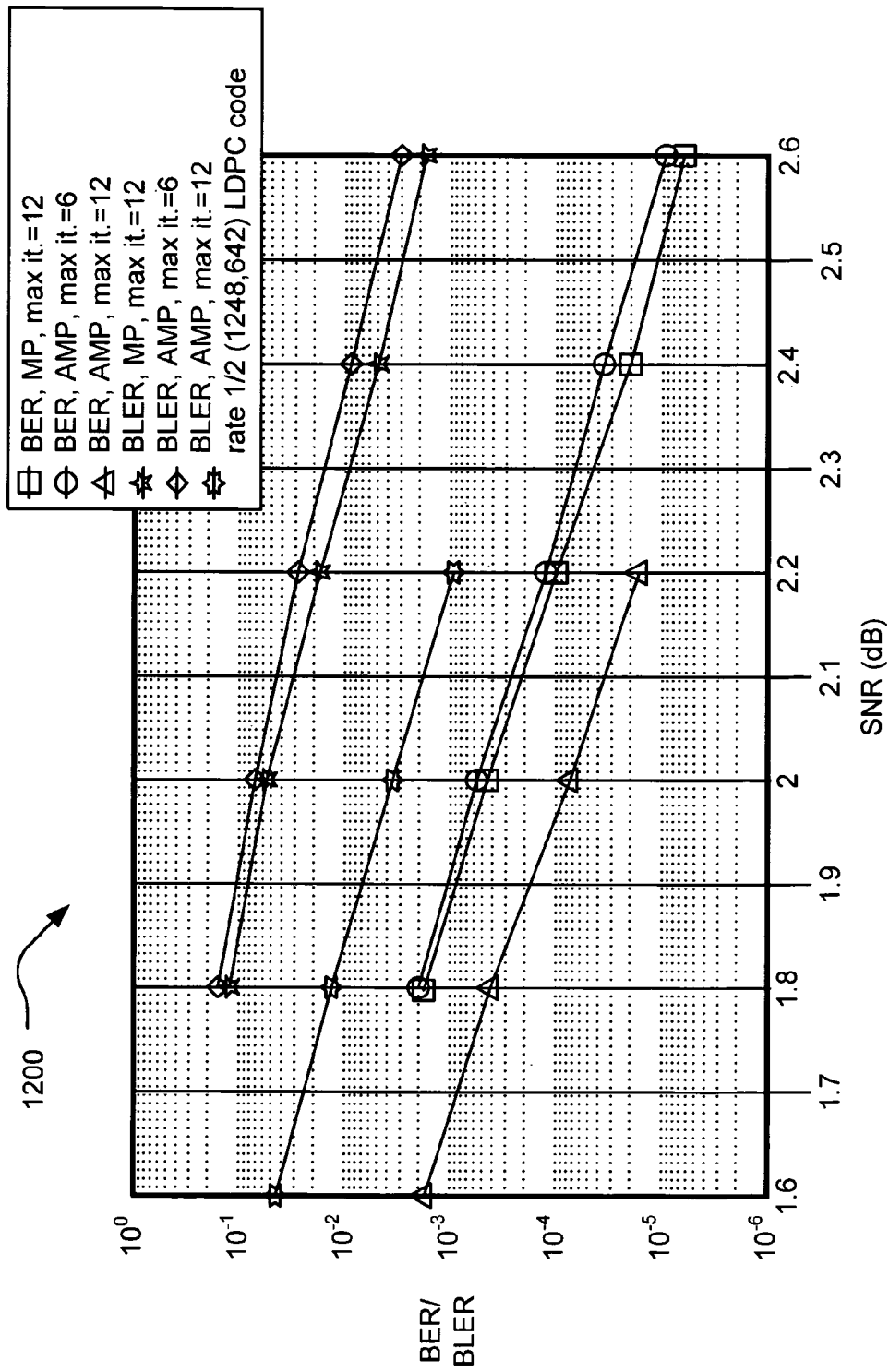
FIG. 12 illustrates an embodiment of a performance comparison of MP (Message Passing) decoding processing and AMP (Accelerated Message Passing) decoding processing.

FIG. 12 illustrates an embodiment of a performance comparison 1200 of MP (Message Passing) decoding processing and AMP (Accelerated Message Passing) decoding processing. This performance diagram considers the (1248,624) LDPC code that is referred to above.

Using the various novel and improved decoding approaches presented herein, it can be seen that the same performance may be achieved using the novel AMP decoding processing approach presented herein while saving almost 50% of the number of decoding iterations. Moreover, when performing a similar number of decoding iterations, the AMP decoding processing approach can provide approximately 0.2 dB gain in performance with respect to BER/BLER as a function of $E_b/N_o$ (or SNR) when compared to the MP (Message Passing) decoding processing approach. Therefore, embodiments of the novel decoding approach presented herein can provide for decoding of LDPC coded signals with a much improved performance when compared to prior art decoding approaches and/or comparable (and typically better performance) than prior art decoding approaches when performing significantly fewer decoding iterations.

It is noted that performance of the prior art layered decoding approach referenced above in the "DESCRIPTION OF RELATED ART" section is not shown in this performance diagram of FIG. 12, as the performance of such prior art layered decoding approach suffers from a relatively higher error rate than the AMP decoding processing approach presented herein.

FIG. 13, FIG. 14, and FIG. 15 illustrate various embodiments of methods for decoding LDPC (Low Density Parity Check) coded signals Referring to embodiment 1300 of the FIG. 13, as shown in a block 1310, the method involves calculating a first soft bit information corresponding to a first square sub-matrix. This can be viewed from the perspective of performing decoding processing when using a parity check matrix that corresponds to an LDPC code. Then, the method involves calculating a second soft bit information corresponding to a second square sub-matrix using the first soft bit information corresponding to the first square sub-matrix as shown in a block 1320, and the method involves calculating a third soft bit information corresponding to a third square sub-matrix using the second soft bit information corresponding to the second square sub-matrix as shown in a block 1330. Ultimately, as shown in a block 1340, the method involves performing iterative error correction decoding of an LDPC coded signal to generate a best estimate of at least one information bit that has been encoded into the LDPC coded signal.

As mentioned above with respect to some other embodiments, the decoding processing may be viewed as cascading the soft bit information (that is calculated with respect to the various square sub-matrices within the parity check matrix) downward through the columns of the parity check matrix.

Referring to embodiment 1400 of the FIG. 14, as shown in a block 1410, the method involves calculating a first soft bit information corresponding to a first square sub-matrix. The method also involves calculating a second soft bit information corresponding to a second square sub-matrix using the first soft bit information corresponding to the first square sub-matrix as shown in a block 1420. The first square sub-matrix and the second square sub-matrix may be aligned within a column of a parity check matrix.

The method then continues by calculating an intermediate information using a difference between the second soft bit information corresponding to the second square sub-matrix and an edge message with respect to a corresponding check node as shown in a block 1430. The method then involves updating the edge message with respect to the corresponding check node using the first intermediate information as shown in a block 1450. The method ultimately involves performing iterative error correction decoding of an LDPC coded signal to generate a best estimate of at least one information bit that has been encoded into the LDPC coded signal as shown in a block 1460.

Referring to embodiment 1500 of the FIG. 15, as shown in a block 1510, the method involves calculating a first soft bit information corresponding to a first square sub-matrix. Then, the method involves calculating a second soft bit information corresponding to a second square sub-matrix using the first soft bit information corresponding to the first square sub-matrix as shown in a block 1520. As also mentioned above with respect to some other embodiments, the first square sub-matrix and the second square sub-matrix of this embodiment 1500 may also be aligned within a column of a parity check matrix.

The method then continues by calculating a first intermediate information using a difference between an edge message with respect to a corresponding check node and the second soft bit information corresponding to the second square sub-matrix, as shown in a block 1530, and by calculating a second intermediate information using a difference between the edge message with respect to the corresponding check node and a sum of the second soft bit information corresponding to the second square sub-matrix and the first soft bit information corresponding to the first square sub-matrix, as shown in a block 1540.

The method then also involves updating the edge message with respect to the corresponding check node using the first intermediate information as shown in a block 1550. The method ultimately involves performing iterative error correction decoding of an LDPC coded signal to generate a best estimate of at least one information bit that has been encoded into the LDPC coded signal as shown in a block 1560.

It is also noted that any of the method embodiments described within the preceding figures may also be performed within any of a number of appropriate system and/or apparatus designs (communication systems, communication transmitters, communication receivers, communication transceivers, and/or functionality) without departing from the scope and spirit of the invention.

Moreover, it is also noted that the various functionality, system and/or apparatus designs, and method related embodiments that are described herein may all be implemented in the logarithmic domain (e.g., log domain) thereby enabling multiplication operations to be performed using addition and division operations to be performed using subtraction.

In view of the above detailed description of the invention and associated drawings, other modifications and variations will now become apparent. It should also be apparent that such other modifications and variations may be effected without departing from the spirit and scope of the invention.

What is claimed is:

1. An AMP (Accelerated Message Passing) decoder that is operable to decode an LDPC (Low Density Parity Check) coded signal, the decoder comprising:
    a soft bit update processor that is operable to calculate a second soft bit information corresponding to a second square sub-matrix using a first soft bit information corresponding to a first square sub-matrix, wherein:
        a column, of a parity check matrix that corresponds to a generator matrix employed to generate the LDPC coded signal, includes the first square sub-matrix and the second square sub-matrix; and
    a check engine that is operable to update an edge message with respect to a corresponding check node using the second soft bit information corresponding to the second square sub-matrix or the first soft bit information corresponding to a first square sub-matrix.

2. The decoder of claim 1, wherein:
    the soft bit update processor is operable to calculate a third soft bit information corresponding to a third square sub-matrix using the second soft bit information corresponding to the second square sub-matrix; and
    the column, of the parity check matrix that corresponds to the generator matrix employed to generate the LDPC coded signal, also includes the third square sub-matrix.

3. The decoder of claim 1, wherein:
    the decoder is operable to decode each of the first square sub-matrix and the second square sub-matrix individually.

4. The decoder of claim 1, wherein:
    the soft bit update processor and the check engine operate cooperatively to perform iterative error correction decoding of the LDPC coded signal to generate a best estimate of at least one information bit that has been encoded into the LDPC coded signal.

5. The decoder of claim 1, wherein:
the decoder is operable to decode LDPC coded signals that are compliant with DVB-S2 (Digital Video Broadcasting Project-Satellite Version 2) standard.

6. The decoder of claim 1, wherein:
the edge message with respect to the corresponding check node is a third edge message with respect to the corresponding check node; and
the check engine is operable to:
update the third edge message with respect to the corresponding check node using a difference between the second soft bit information corresponding to the second square sub-matrix and a second edge message with respect to a corresponding check node; or
update the third edge message with respect to the corresponding check node using a difference between the first soft bit information corresponding to the second square sub-matrix and a first edge message with respect to a corresponding check node.

7. The decoder of claim 6, wherein:
the column, that comprises the first square sub-matrix and the second square sub-matrix, has a weight of one.

8. The decoder of claim 1, further comprising:
an intermediate information calculation block that is operable to calculate an intermediate information using a difference between the second soft bit information corresponding to the second square sub-matrix and the edge message with respect to the corresponding check node.

9. The decoder of claim 8, wherein:
the column, that comprises the first square sub-matrix and the second square sub-matrix, has a weight greater than one.

10. The decoder of claim 1, wherein:
the soft bit update processor that is operable to calculate the second soft bit information corresponding to a second square sub-matrix using LLR (Log-Likelihood Ratio) information of a bit corresponding to the second soft bit information, the updated edge message with respect to the corresponding check node, and at least one additional edge message with respect to a corresponding check node.

11. The decoder of claim 10, further comprising:
an edge memory, communicatively coupled to the soft bit update processor, from which the at least one additional edge message with respect to the corresponding check node is retrieved.

12. An AMP (Accelerated Message Passing) decoder that is operable to decode an LDPC (Low Density Parity Check) coded signal, the decoder comprising:
a soft bit update processor that is operable to calculate a second soft bit information corresponding to a second square sub-matrix using a first soft bit information corresponding to a first square sub-matrix, wherein:
a column, of a parity check matrix that corresponds to a generator matrix employed to generate the LDPC coded signal, includes the first square sub-matrix and the second square sub-matrix;
a first intermediate information calculation block that is operable to calculate a first intermediate information using a difference between an edge message with respect to a corresponding check node and the second soft bit information corresponding to the second square sub-matrix;
a second intermediate information calculation block that is operable to calculate a second intermediate information using a difference between the edge message with respect to the corresponding check node and a sum of the second soft bit information corresponding to the second square sub-matrix and the first soft bit information corresponding to the first square sub-matrix; and
a check engine that is operable to update the edge message with respect to the corresponding check node using the first intermediate information.

13. The decoder of claim 12, wherein:
the soft bit update processor is operable to calculate the second soft bit information corresponding to a second square sub-matrix using the second intermediate information and the updated edge message with respect to the corresponding check node.

14. The decoder of claim 12, wherein:
the soft bit update processor is operable to calculate a third soft bit information corresponding to a third square sub-matrix using the second soft bit information corresponding to the second square sub-matrix;
the column, of the parity check matrix that corresponds to the generator matrix employed to generate the LDPC coded signal, also includes the third square sub-matrix.

15. The decoder of claim 12, wherein:
the decoder is operable to decode each of the first square sub-matrix and the second square sub-matrix individually.

16. The decoder of claim 12, wherein:
the soft bit update processor and the check engine operate cooperatively to perform iterative error correction decoding of the LDPC coded signal to generate a best estimate of at least one information bit that has been encoded into the LDPC coded signal.

17. A method for decoding an LDPC (Low Density Parity Check) coded signal, the method comprising:
calculating a second soft bit information corresponding to a second square sub-matrix using a first soft bit information corresponding to a first square sub-matrix, wherein a column, of a parity check matrix that corresponds to a generator matrix employed to generate the LDPC coded signal, includes the first square sub-matrix and the second square sub-matrix; and
performing iterative error correction decoding of the LDPC coded signal to generate a best estimate of at least one information bit that has been encoded into the LDPC coded signal.

18. The method of claim 17, further comprising:
individually decoding each of the first square sub-matrix and the second square sub-matrix.

19. The method of claim 17, further comprising:
calculating a first intermediate information using a difference between an edge message with respect to a corresponding check node and the second soft bit information corresponding to the second square sub-matrix;
calculating a second intermediate information using a difference between the edge message with respect to the corresponding check node and a sum of the second soft bit information corresponding to the second square sub-matrix and the first soft bit information corresponding to the first square sub-matrix; and
updating the edge message with respect to the corresponding check node using the first intermediate information.

20. The method of claim 17, further comprising:
calculating an intermediate information using a difference between the second soft bit information corresponding to the second square sub-matrix and an edge message with respect to a corresponding check node; and
updating the edge message with respect to the corresponding check node using the intermediate information.

\* \* \* \* \*